United States Patent
Shen et al.

(10) Patent No.: US 11,171,741 B2
(45) Date of Patent: Nov. 9, 2021

(54) POLAR CODE TRANSMISSION METHOD AND APPARATUS

(71) Applicant: HUAWEI TECHNOLOGIES CO., LTD., Guangdong (CN)

(72) Inventors: Zukang Shen, Beijing (CN); Yunfei Qiao, Hangzhou (CN); Rong Li, Hangzhou (CN); Hejia Luo, Hangzhou (CN); Shengchen Dai, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 175 days.

(21) Appl. No.: 16/685,366

(22) Filed: Nov. 15, 2019

(65) Prior Publication Data

US 2020/0083984 A1   Mar. 12, 2020

Related U.S. Application Data

(63) Continuation of application No. PCT/CN2018/086922, filed on May 15, 2018.

(30) Foreign Application Priority Data

May 15, 2017 (CN) .......................... 201710340275.3

(51) Int. Cl.
  *H04L 1/00* (2006.01)
(52) U.S. Cl.
  CPC .......... *H04L 1/0057* (2013.01); *H04L 1/0041* (2013.01); *H04L 1/0045* (2013.01); *H04L 1/0071* (2013.01)

(58) Field of Classification Search
  None
  See application file for complete search history.

(56) References Cited

U.S. PATENT DOCUMENTS

| | | | |
|---|---|---|---|
| 9,503,126 B2 | 11/2016 | Vardy et al. | |
| 2005/0123005 A1 | 6/2005 | Park | |

(Continued)

FOREIGN PATENT DOCUMENTS

| | | |
|---|---|---|
| CN | 1377142 A | 10/2002 |
| CN | 1638315 A | 7/2005 |
| CN | 102164025 A | 8/2011 |
| CN | 104539393 A | 4/2015 |

OTHER PUBLICATIONS

Extended European Search Report issued in European Application No. 18801323.9 dated Apr. 22, 2020, 13 pages.

(Continued)

*Primary Examiner* — Rebecca E Song
(74) *Attorney, Agent, or Firm* — Fish & Richardson P.C.

(57) ABSTRACT

Example polar code-based transmission methods and apparatus are provided, to apply polar encoding to a physical broadcast channel (PBCH). One example method includes performing polar encoding on a to-be-encoded first bit sequence by a transmit end to generate an encoded sequence. The transmit end performs a transformation operation on the encoded sequence to obtain a second bit sequence, where the transformation operation includes at least one of scrambling, interleaving, or reordering. The transmit end sends the second bit sequence in M inconsecutive time units, where at least two time intervals between the time units in the M inconsecutive time units are unequal.

20 Claims, 21 Drawing Sheets

(56) References Cited

U.S. PATENT DOCUMENTS

| | | | |
|---|---|---|---|
| 2015/0333775 A1 | 11/2015 | Korb et al. | |
| 2019/0207710 A1* | 7/2019 | Ye | H03M 13/6306 |
| 2020/0099399 A1* | 3/2020 | Xie | H03M 13/13 |
| 2020/0127879 A1* | 4/2020 | Yokomakura | H04W 48/12 |
| 2021/0176739 A1* | 6/2021 | Hui | H04B 7/0695 |

OTHER PUBLICATIONS

Qualcomm Incorporated, "PBCH channel coding," 3GPP TSG-RAN WG1 NR Ad-Hoc#2, R1-1711605, Qingdao, P.R. China, XP051305896, Jun. 27-30, 2017, 10 pages.

Qualcomm Incorporated, "SS block time index indication consideration," 3GPP TSG-RAN WG1 NR #89, R1-1708570; Hangzhou, P.R. China, XP051273763, May 15-19, 2017, 8 pages.

Huawei, "Discussion on SS burst set composition and SS block time index indication" 3GPP TSG RAN WG1 Meeting #88bis, R1-1705052, Agenda Item:8.1.1.1.2, Spokane, USA, Apr. 3-7, 2017, 9 pages.

Huawei, "Soft-combining for PBCH" 3GPP TSG RAN WG1 Meeting #89; R1-1708158, Agenda Item:7.1.4.3, Hangzhou, China, May 15-19, 2017, 9 pages.

Huawei, "Discussion on SS block time index indication" 3GPP TSG RAN WG1 Meeting #89; R1-1708166, Agenda Item:7.1.1.1.3, Hangzhou, China, May 15-19, 2017, 5 pages.

3GPP TS 36.212 V14.2.0 (Mar. 2017);3rd Generation Partnership Project, Technical Specification Group Radio Access Evolved Network, Evolved Universal Terrestrial Radio Access (E-UTRA), Multiplexing and channel coding(Release 14), 197 pages.

PCT International Search Report and Written Opinion in International Application No. PCT/CN2018/086,922, dated Jun. 28, 2018, 15 pages (With English Translation).

Office Action issued in Chinese Application No. 201710340275.3 dated Dec. 20, 2019, 12 pages (With English Translation).

* cited by examiner

POLAR CODE TRANSMISSION METHOD AND APPARATUS

CROSS-REFERENCE TO RELATED APPLICATIONS

This application claims is a continuation of International Application No. PCT/CN2018/086922, filed on May 15, 2018, which claims priority to Chinese Patent Application No. 201710340275.3, filed on May 15, 2017. The disclosures of the aforementioned applications are hereby incorporated by reference in their entireties.

TECHNICAL FIELD

Embodiments of this application relate to the field of communications technologies, and in particular, to a polar code transmission method and apparatus.

BACKGROUND

As a most fundamental radio access technology, channel coding plays a critical role in ensuring reliable data transmission. In an existing wireless communications system, a turbo code, a low-density parity-check (Low Density Parity Check, LDPC) code, and a polar (Polar) code are usually used to perform channel coding. The turbo code cannot support information transmission at an excessively low or high code rate. Due to encoding/decoding characteristics of the turbo code and the LDPC code, for medium and short packet transmission, it is difficult for the turbo code and the LDPC code to achieve ideal performance in case of a limited code length. In terms of implementation, the turbo code and the LDPC code have relatively high calculation complexity in an encoding/decoding implementation process. The polar (Polar) code is a high-performance code that has been theoretically proved to be capable of achieving a Shannon capacity and that has relatively low encoding/decoding complexity, and therefore is applied increasingly widely.

However, as the wireless communications system evolves rapidly, a future communications system (for example, a 5G communications system) has some new characteristics. For example, three most typical communications scenarios include enhanced mobile broadband (Enhance Mobile Broadband, eMBB), massive machine type communications (Massive Machine Type Communications, mMTC), and ultra-reliable and low latency communications (Ultra-Reliable and Low Latency Communications, URLLC). A higher requirement is imposed for polar encoding/decoding performance in these communications scenarios.

However, at a current stage, polar encoding/decoding performance is still not ideal in an application process, and needs to be further improved.

SUMMARY

Embodiments of this application provide a polar code transmission method and apparatus, to improve polar encoding/decoding performance.

Specific technical solutions provided in the embodiments of this application are as follows:

According to a first aspect, a polar code transmission method is provided. At least two levels of transformation are performed on a sequence obtained after polar encoding, and a sequence obtained after the transformation is sent in inconsecutive time units. In this way, a receive end can perform soft combination on to-be-decoded information. This improves information transmission reliability, ensures communication quality, and helps better apply polar encoding to a PBCH.

In a possible design, a transmit end performs polar encoding on a to-be-encoded first bit sequence, to generate an encoded sequence; the transmit end performs a transformation operation on the encoded sequence, to obtain a second bit sequence; and the transmit end sends the second bit sequence in M inconsecutive time units, where at least two time intervals between the time units in the M inconsecutive time units are unequal, and the transformation operation includes at least one of scrambling, interleaving, and reordering. This helps the receive end obtain inverse transformation amounts based on different time intervals to correctly perform soft combination.

In a possible design, that the transmit end performs a transformation operation on the encoded sequence is implemented in the following manner: The transmit end performs at least two levels of grouping on the encoded sequence; and the transmit end transforms a sequence obtained after each-level grouping, where a transformation amount used to transform the sequence obtained after one level of grouping is used to indicate a time sequence index value in one level of time sequence transmission.

In a possible design, M transformation amounts are used for a sequence obtained after one of the at least two levels of grouping, and the M transformation amounts are used to indicate time sequence index values of the M inconsecutive time units. Optionally, one of the M transformation amounts is used to indicate a time sequence index value of one of the M time units.

In a possible design, a time interval between two time units is used to indicate a manner in which the receive end performs soft combination on signals received in the two time units. The soft combination manner is using an inverse transformation amount for the soft combination.

In a possible design, the time interval between the two time units is used to indicate respective time sequence indexes of the two time units. Specifically, different time intervals may help the receive end determine transformation amounts used for signals received in the two time units, to determine inverse transformation amounts, correctly perform inverse transformation, and further perform soft combination. One transformation amount represents one time sequence index.

In a possible design, the transformation operation is cyclic shift. The transformation amount is a cyclic shift value.

According to a second aspect, a polar code-based transmission method is provided. A receive end receives to-be-decoded information; the receive end performs a first inverse transformation operation and polar code decoding on the to-be-decoded information based on time intervals between M inconsecutive time units, where at least two time intervals between the time units in the M inconsecutive time units are unequal, and the inverse transformation operation includes at least one of descrambling, de-interleaving, and inverse reordering; and the receive end performs a second inverse transformation operation on a decoded sequence. In this way, the receive end can perform soft combination on the to-be-decoded information. This improves information transmission reliability, ensures communication quality, and helps better apply polar encoding to a PBCH.

In a possible design, the receive end determines, based on a time interval between two time units, time sequence index values of signals sent in the two time units.

In a possible design, that the receive end performs second inverse transformation on a decoded sequence is implemented in the following manner: The receive end performs at least two levels of grouping on the decoded sequence; and the receive end performs second inverse transformation on a sequence obtained after each-level grouping except $i^{th}$-level grouping, where M inverse transformation amounts are used for a sequence obtained after the $i^{th}$-level grouping, and the M inverse transformation amounts are used to indicate time sequence index values of the M inconsecutive time units.

In a possible design, that the receive end performs a first inverse transformation operation and polar code decoding on the to-be-decoded information based on time intervals between M inconsecutive time units is implemented in the following manner: The receive end determines, based on the time intervals between the M inconsecutive time units, a first inverse transformation amount used for a sending sequence in each time unit; the receive end performs first inverse transformation on the to-be-decoded information by using the first inverse transformation amount, and performs soft combination on sequences obtained after the first inverse transformation; and the receive end performs polar code decoding on a sequence obtained after the soft combination.

In a possible implementation, the inverse transformation operation is cyclic shift.

According to a third aspect, a polar code-based transmission apparatus is provided. The apparatus has functions of implementing behavior of the transmit end according to any one of the first aspect and the possible designs of the first aspect. The functions may be implemented by using hardware, or may be implemented by executing corresponding software by hardware. The hardware or the software includes one or more modules corresponding to the functions.

In a possible design, when some or all of the functions are implemented by using hardware, the polar code-based transmission apparatus includes: an input interface circuit, configured to obtain a to-be-encoded first bit sequence; a logic circuit, configured to perform behavior of the transmit end according to any one of the first aspect and the possible designs of the first aspect; and an output interface circuit, configured to output a second bit sequence.

Optionally, the polar code-based transmission apparatus may be a chip or an integrated circuit.

In a possible design, when some or all of the functions are implemented by using software, the polar code-based transmission apparatus includes: a memory, configured to store a program; and a processor, configured to execute the program stored in the memory. When the program is executed, the polar code-based transmission apparatus can implement the method according to any one of the first aspect and the possible designs of the first aspect.

Optionally, the memory may be a physically independent unit, or may be integrated with the processor.

In a possible design, when some or all of the functions are implemented by using software, the polar code-based transmission apparatus includes a processor. A memory configured to store a program is located outside the encoding apparatus. The processor is connected to the memory by using a circuit/wire, and is configured to read and execute the program stored in the memory.

According to a fourth aspect, a polar code-based transmission apparatus is provided. The apparatus has functions of implementing behavior of the receive end according to any one of the second aspect and the possible designs of the second aspect. The functions may be implemented by using hardware, or may be implemented by executing corresponding software by hardware. The hardware or the software includes one or more modules corresponding to the functions.

In a possible design, when some or all of the functions are implemented by using hardware, the polar code-based transmission apparatus includes: an input interface circuit, configured to obtain to-be-decoded information; a logic circuit, configured to perform behavior of the receive end according to any one of the second aspect and the possible designs of the second aspect; and an output interface circuit, configured to output a bit sequence obtained after polar code decoding.

Optionally, the polar code-based transmission apparatus may be a chip or an integrated circuit.

In a possible design, when some or all of the functions are implemented by using software, the polar code-based transmission apparatus includes: a memory, configured to store a program; and a processor, configured to execute the program stored in the memory. When the program is executed, the polar code-based transmission apparatus can implement the method according to any one of the second aspect and the possible designs of the second aspect.

Optionally, the memory may be a physically independent unit, or may be integrated with the processor.

In a possible design, when some or all of the functions are implemented by using software, the polar code-based transmission apparatus includes a processor. A memory configured to store a program is located outside the encoding apparatus. The processor is connected to the memory by using a circuit/wire, and is configured to read and execute the program stored in the memory.

According to a fifth aspect, a wireless communications system is provided. The system includes the apparatus according to the third aspect and the apparatus according to the fourth aspect.

According to a sixth aspect, a computer storage medium is provided, and is configured to store a computer program. The computer program includes an instruction used to perform the method according to any one of the first aspect, the second aspect, the possible implementations of the first aspect, or the possible implementations of the second aspect.

According to a seventh aspect, a computer program product including an instruction is provided. When the computer program product is run on a computer, the computer is enabled to perform the methods according to the foregoing aspects.

DESCRIPTION OF EMBODIMENTS

The following describes in detail the embodiments of this application with reference to the accompanying drawings.

Figure 1:
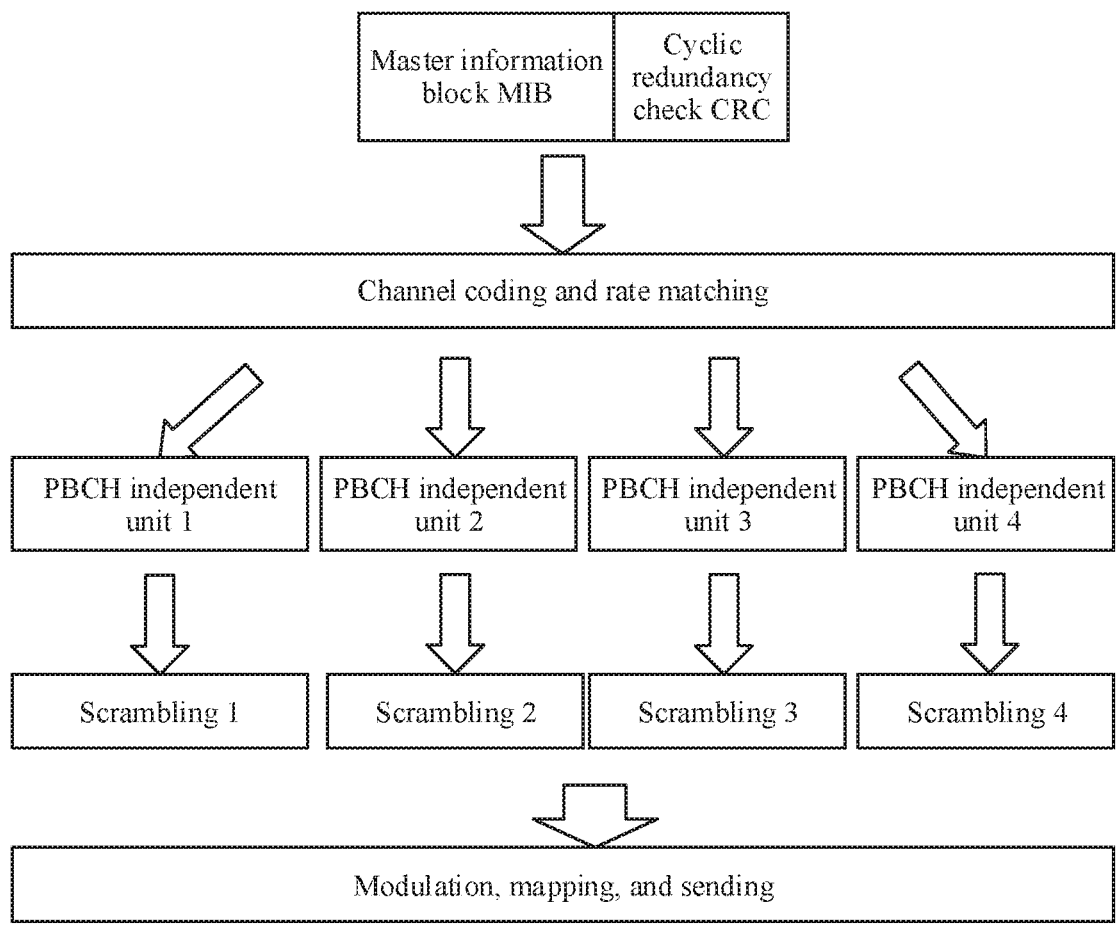
FIG. 1 is a schematic diagram of a PBCH processing process at a transmit end in the prior art.

In a long term evolution (English: Long Term Evolution, LTE for short) system, a physical broadcast channel (English: Physical Broadcast Channel, PBCH for short) carries a master information block (English: Master Information Block, MIB for short). A length of the MIB is 2four bits (bit). The MIB includes content such as downlink system bandwidth, a size of a physical hybrid automatic repeat request indicator channel (English: Physical Hybrid ARQ Indicator Channel, PHICH), and 8 most significant bits of a system frame number (English: System Frame Number, SFN for short). A PBCH processing process at a transmit end is shown in FIG. 1. A base station first performs cyclic redundancy check (English: Cyclic Redundancy Check, CRC for short) encoding on a to-be-sent MIB, to obtain a 16-bit CRC sequence. Then, the base station performs channel coding and rate matching on a 40-bit sequence (including the 24-bit MIB and the 16-bit CRC), to obtain an encoded sequence; replicates the encoded sequence to obtain four PBCH independent units with a same size, where all the PBCH independent units carry same data; and respectively scrambles the four PBCH independent units by using four scrambling sequences. Finally, the base station completes procedures such as modulation, mapping, sending after the scrambling.

A tail-biting convolutional code (English: tail-biting convolutional code, TBCC for short) is used for channel coding of the PBCH, and different phases are used for the four scrambling sequences. The four PBCH independent units carry same encoded bits, and after the procedures such as scrambling, modulation, and mapping are performed on the four PBCH independent units, the four PBCH independent units are sent in a time interval of 40 ms (a transmission time of four radio frames, where each radio frame is 10 ms).

Figure 2:
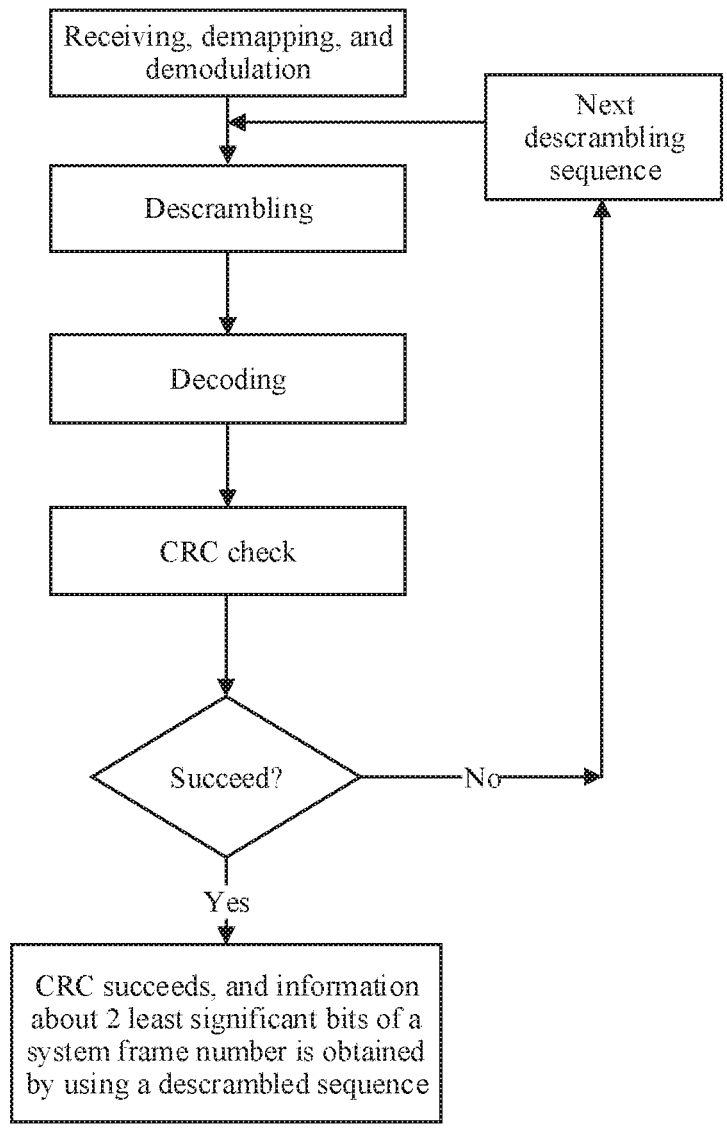
FIG. 2 is a schematic diagram of a PBCH processing process at a receive end in the prior art.

A PBCH processing process at a receive end is shown in FIG. 2. It can be learned from the descriptions of the transmit end that the four PBCH independent units carry the same encoded bits. Therefore, when channel quality is good enough, the receive end can successfully complete descrambling, decoding, and CRC check operations by receiving only one PBCH independent unit within 40 ms. Because the receive end learns of, by using a scrambling sequence that is successfully descrambled, a specific radio frame in which the transmit end sends the MIB within 40 ms, the receive end knows 2 least significant bits of the SFN. When channel quality is relatively poor, if the receive end cannot successfully perform descrambling and decoding by receiving only one PBCH independent unit, the receive end performs soft combination on the PBCH independent unit and a PBCH independent unit that is sent in next 10 ms, and then performs decoding, until decoding succeeds.

A fifth generation (English: 5th Generation, 5G for short) 5G communications technology or a communications technology after the 5G greatly differs from a 4G communications technology. Therefore, a PBCH encoding/decoding scheme in LTE cannot be still used, and a new solution is required.

The embodiments of this application may be applied to a 5G communications system, and may be applied to a scenario in which polar encoding and decoding are performed on information, for example, may be applied to a scenario in which polar encoding and decoding are performed on uplink control information and downlink control information in eMBB, or may be applied to other scenarios, for example, applied to channel coding (Channel Coding) in section 5.1.3 of the communications standard TS 36.212 and channel coding of uplink control information, downlink control information, and a sidelink channel in section 5.1.3 of the communications standard TS 36.212. This is not limited in the embodiments of this application. More specifically, the embodiments of this application may be applied to application scenarios in which implicit information needs to be transmitted. For example, in a scenario 1 of implicit transmission of a PBCH time sequence, soft combination of signals transmitted a plurality of times and time-sequence blind detection may be supported. In a scenario 2 of implicit information transmission in ultra-reliable and low latency communications (English: Ultra-reliable and Low Latency Communications, URLLC), both multiple-division concurrent transmission and information blind detection may be supported. In a scenario 3 of common single transmission, information blind detection is supported.

Figure 3:
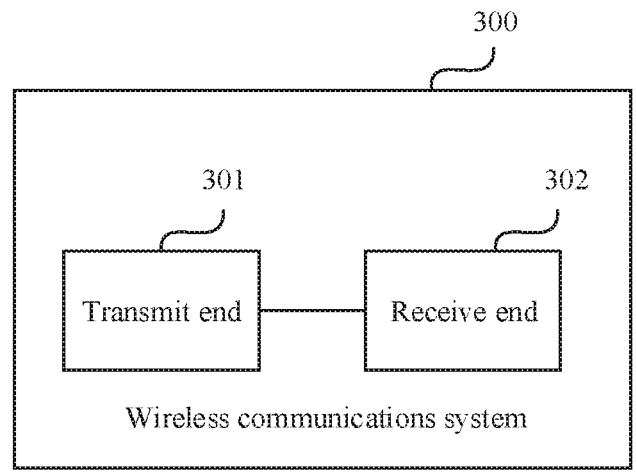
FIG. 3 is a schematic diagram of a wireless communications system according to an embodiment of this application.

As shown in FIG. 3, a wireless communications system 300 to which an embodiment of this application is applied includes a transmit end 301 and a receive end 302. The transmit end 301 may be a network device, and the receive end 302 is a terminal. Alternatively, the transmit end 301 is a terminal, and the receive end 302 is a network device. The network device may be a base station, a device integrating a base station and a base station controller, or another device having a similar communication function. The transmit end 301 is an encoding side, and the receive end 302 is a decoding side. Alternatively, the transmit end 301 and the receive end 302 may be other devices having an encoding/decoding function.

It should be noted that the wireless communications system mentioned in this embodiment of this application includes but is not limited to a narrowband internet of things (English: Narrow Band-Internet of Things, NB-IoT for short) system, a global system for mobile communications (English: Global System for Mobile Communications, GSM for short), an enhanced data rates for GSM evolution (English: Enhanced Data rates for GSM Evolution, EDGE for short) system, a wideband code division multiple access (English: Wideband Code Division Multiple Access, WCDMA for short) system, a code division multiple access 2000 (English: Code Division Multiple Access, CDMA2000 for short) system, a time division-synchronous code division multiple access (English: Time Division-Synchronous Code Division Multiple Access, TD-SCDMA for short) system, a long term evolution (English: Long Term Evolution, LTE for short) system, three major application scenarios eMBB. URLLC, and eMTC in a next-generation 5G mobile communications system, or a future new communications system.

The terminal in this embodiment of this application may include various handheld devices, vehicle-mounted devices, wearable devices, or computing devices that have a wireless communication function, or other processing devices connected to a wireless modem. The terminal may be an MS (English: Mobile Station), a subscriber unit (English: subscriber unit), a cellular phone (English: cellular phone), a smartphone (English: smart phone), a wireless data card, a personal digital assistant (English: Personal Digital Assistant, PDA for short) computer, a tablet computer, a wireless modem (English: modem), a handheld device (English: handset), a laptop computer (English: laptop computer), a machine type communication (English: Machine Type Communication. MTC for short) terminal, or the like.

For ease of understanding of the embodiments of this application, the following briefly describes a polar code.

In an encoding policy of the polar code, a noiseless channel is used to transmit useful information of a user, a pure noisy channel is used to transmit agreed information or is not used to transmit information. The polar code is a linear block code. An encoding matrix of the polar code is $G_N$, and an encoding process is $x_1^N = u_1^N G_N$, where $u_1^N = (u_1, u_2 \ldots, u_N)$ is a binary row vector with a length of N (namely, a code length), $G_N$ is an N×N matrix, $G_N = F_2^{\otimes(\log_2(N))}$, and $F_2^{\otimes(\log_2(N))}$ is defined as a Kronecker (Kronecker) product of $\log_2 N$ matrices $F_2$. The matrix is $$F_2 = \begin{bmatrix} 1 & 0 \\ 1 & 1 \end{bmatrix}.$$

In the encoding process of the polar code, some bits in $u_1^N$ are used to carry information and are referred to as an information bit set, and a set of indexes of these bits is denoted as A. The other bits are set to fixed values that are agreed on by a receive end and a transmit end in advance and are referred to as a fixed bit set or a frozen bit set (frozen bits), and a set of indexes of these bits is denoted as $A^c$ that is a complementary set of A. The encoding process of the polar code is equivalent to $x_1^N = u_A G_N(A) \oplus u_{A^c} G_N(A^c)$ Herein. $G_N(A)$ is a submatrix that is of $G_N$ and that is obtained based on rows corresponding to the indexes in the set A; $G_N(A^c)$ is a submatrix that is of $G_N$ and that is obtained based on rows corresponding to the indexes in the set $A^c$; $u_A$ is an information bit set in $u_1^N$, and a quantity of information bits is K; and $u_{A^c}$ is a fixed bit set in $u_1^N$, a quantity of fixed bits is (N-K), and the fixed bits are known bits. These fixed bits are usually set to 0. However, the fixed bits may be set to any value provided that the value is agreed on by the receive end and the transmit end in advance. Therefore, encoding output of the polar code may be simplified as: $x_1^N = u_A G_N(A)$. Herein, $u_A$ is the information bit set in $u_1^N$, $u_A$ is a row vector with a length of K, that is, |A|=K, where |•| represents a quantity of elements in the set, K is an information block size, $G_N(A)$ is the submatrix that is of the matrix $G_N$ and that is obtained based on the rows corresponding to the indexes in the set A and $G_N(A)$ is a K×N matrix.

A process of constructing the polar code is a process of selecting the set A. This determines performance of the polar code. The process of constructing the polar code usually includes: determining, based on the mother code length N, that there are a total of N polar channels that respectively correspond to N rows of the encoding matrix; calculating reliability of the polar channels; and using indexes of first K polar channels with relatively high reliability as elements in the set A, and using indexes corresponding to the remaining (N-K) polar channels as elements in the set $A^c$ of the indexes of the fixed bits. A location of the information bit depends on the set A, and a location of the fixed bit depends on the set $A^c$.

Figure 4:
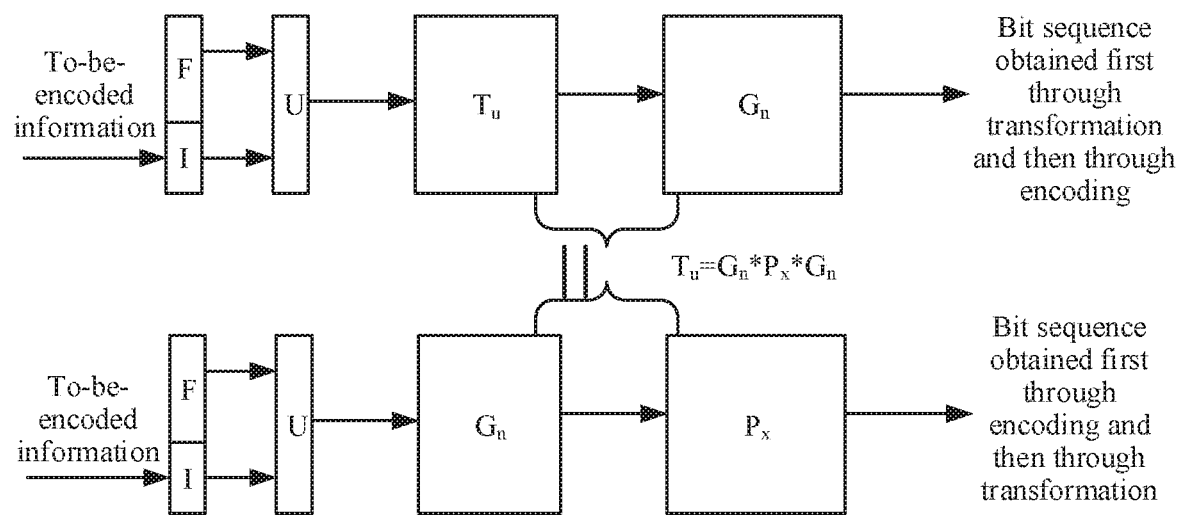
FIG. 4 is a schematic diagram of algebraic characteristics of a polar code according to an embodiment of this application.

As shown in FIG. 4, F is a fixed bit set in a to-be-encoded vector U of a polar code, and includes (N-K) elements. I is a to-be-encoded information bit set in the to-be-encoded vector U of the polar code, and includes K elements. The to-be-encoded information includes an information bit and a check bit. For example, if a check manner is CRC, the check bit is a CRC bit. U is a to-be-encoded information vector or a to-be-encoded bit sequence of the polar code, and is a 1×N vector. $P_x$ is an N×N matrix, and means performing an operation of multiplying an input bit vector by $P_x$. Optionally, $P_x$ is a permutation matrix, namely, a row-column transformation matrix, and there is only one element 1 in each row and each column. Because $P_x$ is a row-column transformation matrix, multiplying the input bit vector by $P_x$ is equivalent to performing an interleaving operation on the input bit vector. More generally, $P_x$ may be referred to as an interleaving matrix. $T_u$ is an N×N matrix, and means performing an operation of multiplying an input bit vector by $T_u$. If $T_u = G_N \cdot P_x \cdot G_N$, in FIG. 4, an operation procedure in the upper half part and an operation procedure in the lower half part have equivalent implementation results, and a same bit sequence is output. $T_u$ may be referred to as a transformation matrix, and $P_x$ may be referred to as an interleaving matrix.

Specifically, in the upper half part of FIG. 4, a to-be-encoded information vector U includes a fixed bit set F and an information bit set I, U is multiplied by the transformation matrix $T_u$, a vector output after the multiplication is encoded by using an encoding matrix $G_N$, and an encoded bit sequence is output. In the lower half part of FIG. 4, a to-be-encoded information vector U includes a fixed bit set F and an information bit set I, U is encoded by using an encoding matrix $G_N$, an encoded vector is multiplied by the interleaving matrix $P_x$, and a bit sequence obtained after the multiplication is output.

If $P_x$ is a cyclic shift matrix, the transformation matrix $T_u$ has a special form and is an upper triangular Toeplitz matrix. An effective interleaving operation needs to meet the following condition: A transformation operation performed on to-be-encoded bits does not affect values of frozen bits, that is, the values of the frozen bits do not change before and after the transformation, and when the frozen bits are all set to 0, it needs to be ensured that the frozen bits are merely a function of the frozen bits before and after the transformation, and are not affected by information bits. A reason is that during polar code decoding, the values of the frozen bits need to be learned of in advance. Otherwise, decoding cannot be performed normally.

Figure 5A:
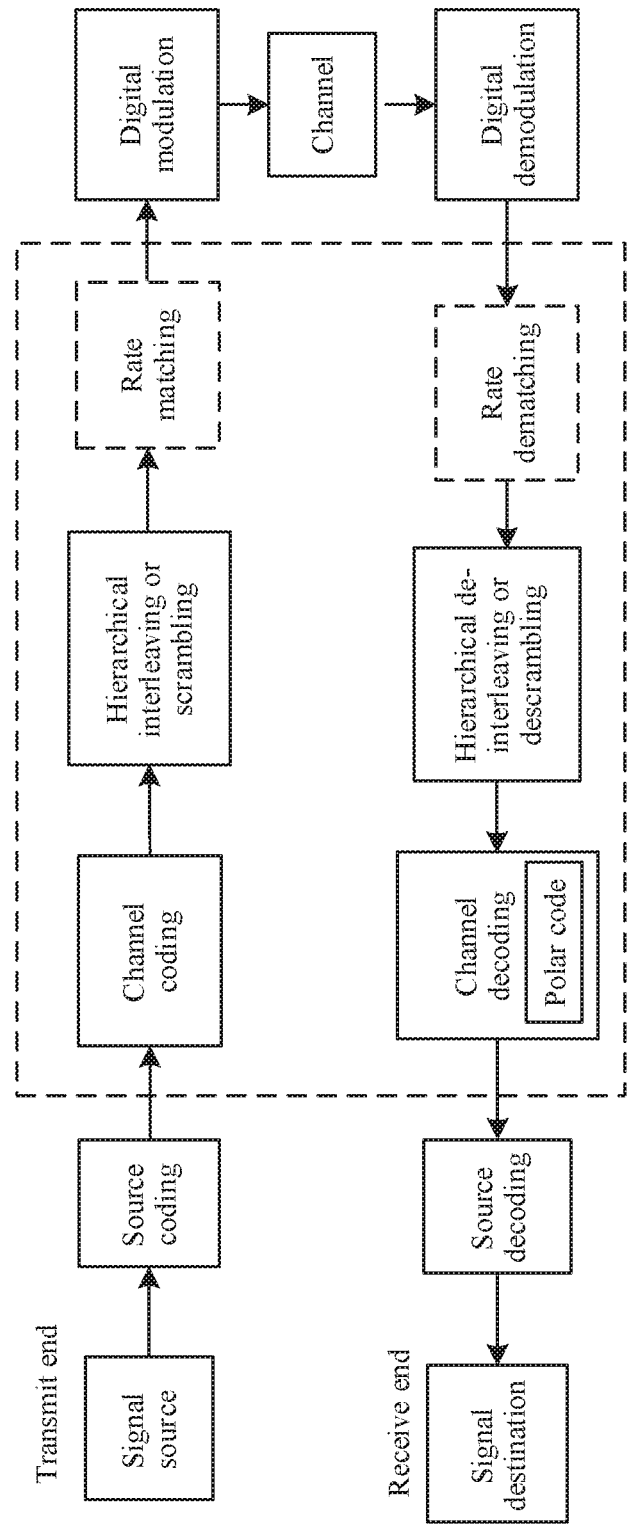
FIG. 5a and FIG. 5b are schematic diagrams of processing procedures on a physical layer in a wireless communications system according to embodiments of this application.
Figure 5B:
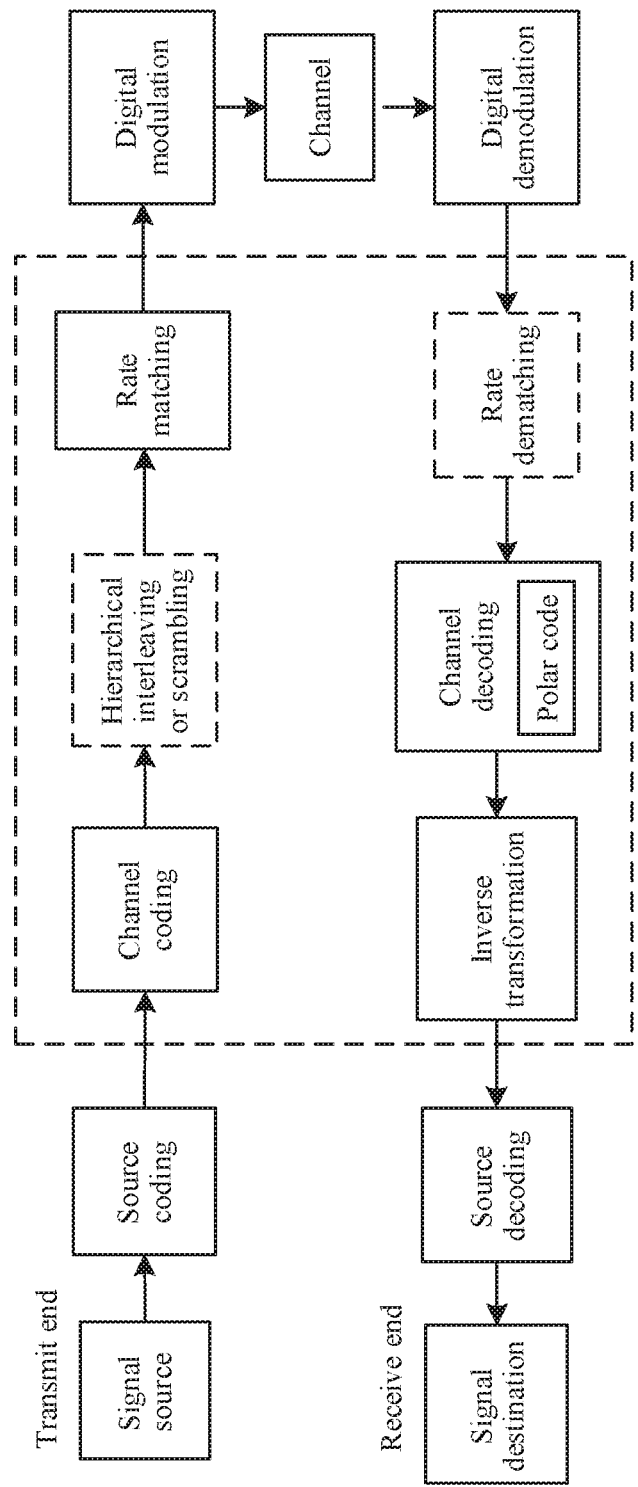

In the encoding process of the polar code, implicit information can be transmitted through interleaving and/or scrambling. For example, time sequence information can be transmitted. FIG. 5a and FIG. 5b are schematic diagrams of processing procedures on a physical layer in a wireless communications system. At a transmit end, a signal source is sent to a receive end through a channel after source coding, channel coding, or rate matching, and digital modulation are sequentially performed. At the receive end, the signal received through the channel arrives at a signal destination after digital demodulation, rate dematching, channel decoding, and source decoding are sequentially performed. In the embodiments of this application, transmission is performed through hierarchical interleaving and/or scrambling that are/is performed based on hierarchical time sequence information, and therefore more time sequence information can be implicitly carried. The hierarchical interleaving and/or scrambling process is performed after channel coding and before rate matching, and a length of a bit sequence on which hierarchical interleaving and/or scrambling are/is performed is the mother code length of the polar code. Alternatively, the hierarchical interleaving or scrambling process may be performed after rate matching, and a length of a bit sequence on which hierarchical interleaving or scrambling is performed is a target length obtained after the rate matching. Referring to FIG. 5a, the hierarchical interleaving or scrambling process is performed after the channel coding and before the rate matching, and correspondingly referring to FIG. 5a, hierarchical de-interleaving or descrambling is performed at the receive end after the rate dematching and before the channel decoding. Referring to FIG. 5b, the hierarchical interleaving or scrambling process is equivalently transformed before the channel coding, and correspondingly, inverse transformation is performed at the receive end after the channel decoding.

Figure 6:
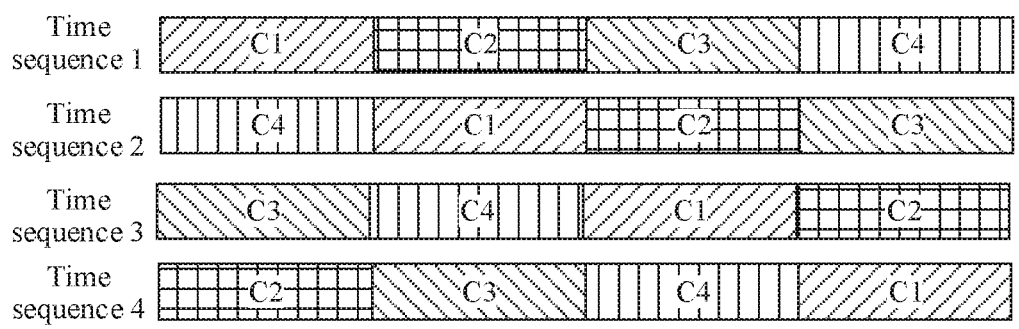
FIG. 6 is a schematic diagram of cyclic shift corresponding to different time sequences according to an embodiment of this application.

To implicitly transmit time sequence information, in a possible implementation, during PBCH transmission, progressive interleaving is performed on an encoded bit sequence, to implicitly carry the time sequence information. For example, cyclic shift is performed, and during each time of transmission within a PBCH period, fixed-length cyclic shift is performed on a previously transmitted codeword. FIG. 6 is a schematic diagram of cyclic shift corresponding to different time sequences. As shown in FIG. 6, a bit sequence obtained after polar encoding is divided into four segments with a same length, and the four segments are respectively denoted as C1, C2, C3, and C4. During transmission of each time sequence, cyclic shift is performed on a previously transmitted encoded codeword. A length of each shift is N/4, where N is a length of the bit sequence obtained after the polar encoding. For example, shift is performed by 0 for the first time, shift is performed by N/4 for the second time based on the shift performed for the first time, and so on. Different cyclic shift values may represent different time sequence information. When the receive end receives signals transmitted a plurality of times, the receive end first performs inverse cyclic shift based on corresponding cyclic shift at the transmit end, then performs soft combination and decoding, and finally blindly detects an absolute length of the cyclic shift through CRC check, to eventually obtain the corresponding time sequence information. However, a limited quantity of available versions are generated in an effective cyclic shift operation. For example, if a cyclic shift length is N/4, only four versions can be generated, and a maximum of four pieces of different time sequence information can be implicitly carried.

Figure 7:
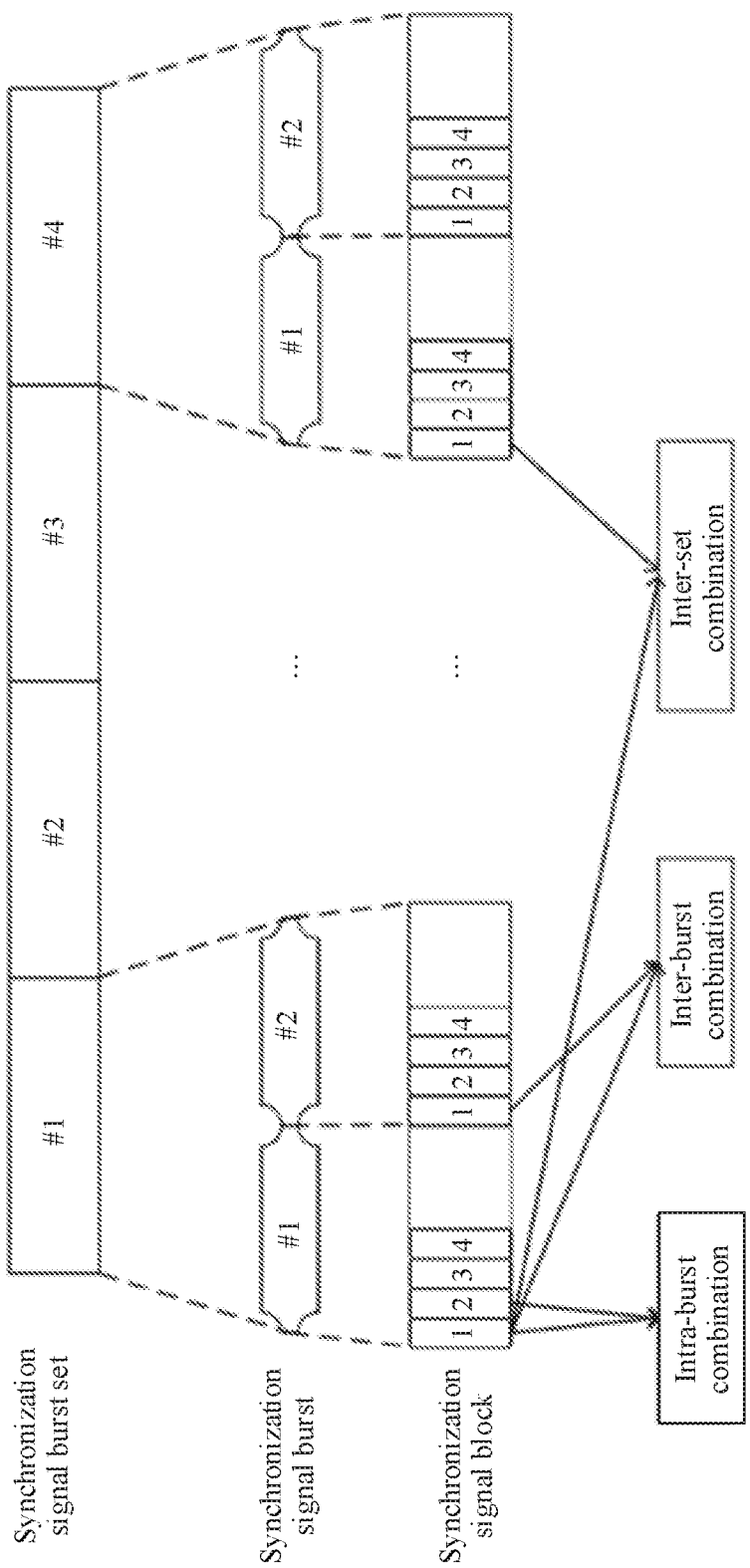
FIG. 7 is a schematic structural diagram of a PBCH according to an embodiment of this application.

In 5G due to introduction of a high frequency, a significant change of a 5G PBCH structure compared with an LTE PBCH structure is an increase in a PBCH sending frequency. As the PBCH sending frequency increases, time sequence transmission on a PBCH includes multi-level time sequence transmission. FIG. 7 is a schematic structural diagram of a PBCH. As shown in FIG. 7, a 5G PBCH is carried in a synchronization signal block (SS block), one synchronization signal burst (SS burst) includes a plurality of synchronization signal blocks, and one synchronization signal burst set (SS burst set) includes a plurality of synchronization signal bursts. Soft combination requirements of synchronization signal blocks may include: combination in one synchronization signal burst, combination in different synchronization signal bursts, or combination in different synchronization signal burst sets. Therefore, a hierarchical time sequence transmission structure is used for sending on the 5G PBCH, and correspondingly multi-level time sequence information is required for indication.

In the embodiments of this application, to meet a multi-level time sequence transmission requirement of the 5G PBCH, hierarchical interleaving is performed on an encoded bit sequence during PBCH transmission, to implicitly carry hierarchical time sequence information. Based on a method for indicating different time sequences by using cyclic shift shown in FIG. 6, FIG. 8a, FIG. 8b, FIG. 8c and FIG. 8d are schematic diagrams of using a two levels of interleaving process according to embodiments of this application. As shown in FIG. 8a to FIG. 8d, a transmit end divides an encoded bit sequence into four sequences (C1, C2, C3, and C4) with a same length; divides each sequence into four subsequences, for example, divides C1 into C11, C12, C13, and C14 and divides C2 into C21, C22, C23, and C24; and separately performs cyclic shift four times on the first-level sequences and the second-level sequences based on the following order: (1,1)→(1,2)→(1,3)→(1,4)→(2,1)→(2,2)→(2,3)→(2,4)→(3,1)→(3,2)→(3, 3)→(3,4)→(4,1)→(4,2)→(4,3)→(4,4), where each pair of parentheses herein represents a time sequence, and in the pair of parentheses, a first-level element indicates first-level time sequence information, and the second element is used as second-level time sequence information.

Figure 8A:
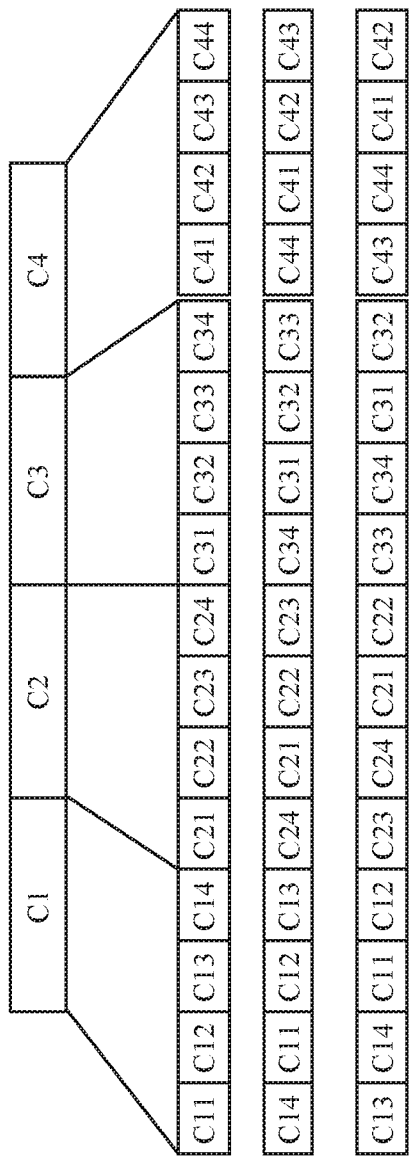
FIG. 8*a* to FIG. 8*d* are schematic diagrams of hierarchical interleaving processes according to embodiments of this application.
Figure 8B:
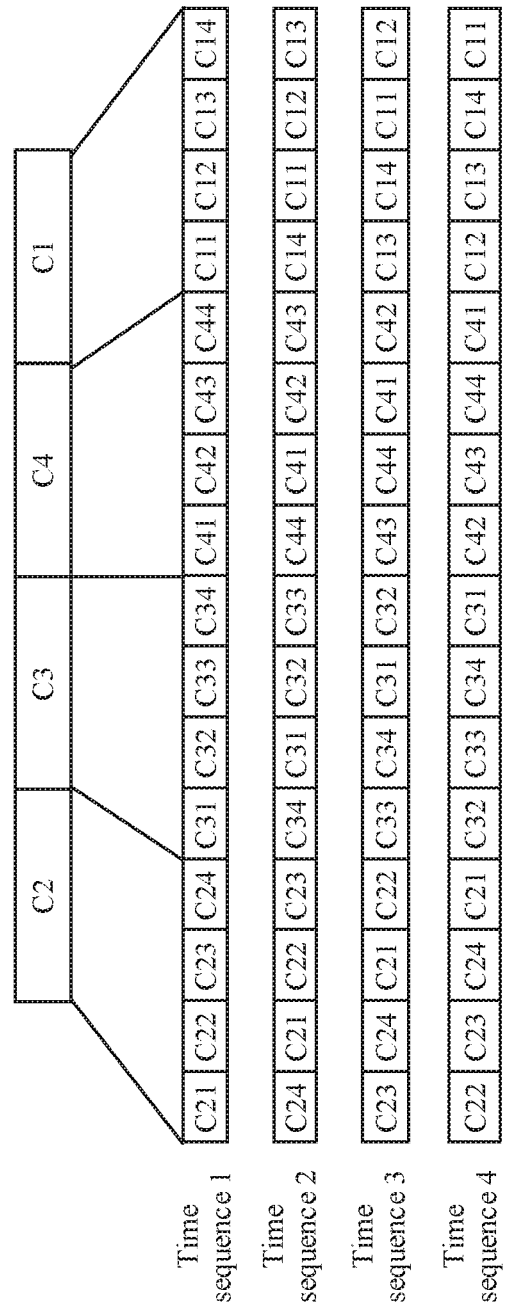
Figure 8C:
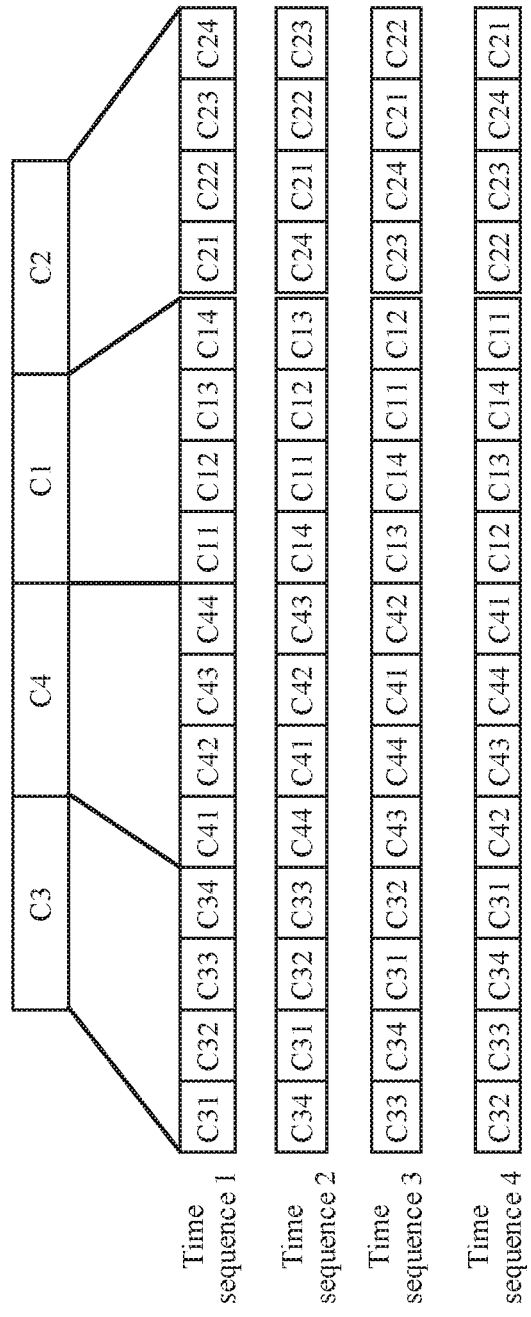
Figure 8D:
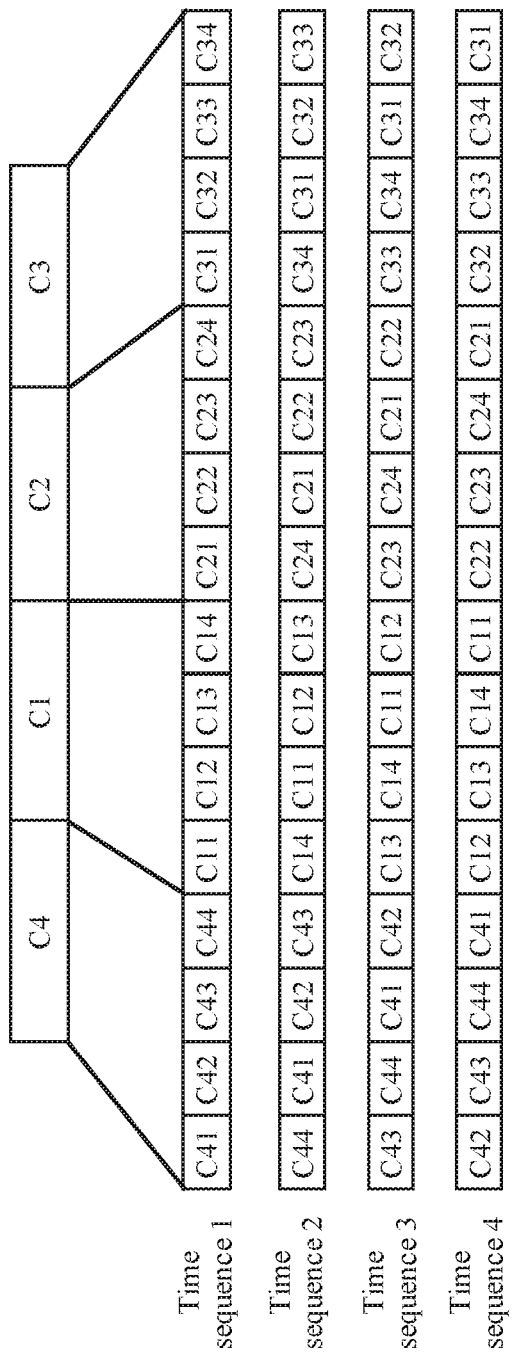

FIG. 8a is a schematic diagram of four time sequences obtained by performing cyclic shift on four second-level sequences when no cyclic shift is performed on a first-level sequence (where a cyclic shift value is 0). FIG. 8b is a schematic diagram of four time sequences obtained by performing cyclic shift on four second-level sequences when cyclic shift is performed on a first-level sequence one time (where a cyclic shift value is N/4). FIG. 8c is a schematic diagram of four time sequences obtained by performing cyclic shift on four second-level sequences when cyclic shift is performed on a first-level sequence two times (where a cyclic shift value is 2N/4). FIG. 8d is a schematic diagram of four time sequences obtained by performing cyclic shift on four second-level sequences when cyclic shift is performed on a first-level sequence three times (where a cyclic shift value is 3N/4). It can be learned that four time sequences can be obtained by performing cyclic shift on each of the four second-level sequences when cyclic shift is not performed or is performed on the first-level sequence one time, two times, or three times. In this way, when a cyclic shift length is N/4, 16 versions can be obtained through two levels of interleaving, different versions in each-level time sequence transmission may represent different time sequence information.

In the embodiments of this application, polar encoding is applied to the PBCH. At least two levels of transformation are performed on a sequence obtained after polar encoding, and a sequence obtained after the transformation is sent in inconsecutive time units. In this way, the receive end can perform soft combination on to-be-decoded information. This improves information transmission reliability, ensures communication quality, and helps better apply polar encoding to the PBCH.

In the embodiments of this application, a transformation operation may include but is not limited to at least one of scrambling, interleaving, and reordering, and an inverse transformation operation may include but is not limited to at least one of descrambling, de-interleaving, and inverse reordering.

The following describes in detail a polar encoding method provided in the embodiments of this application.

Figure 9:
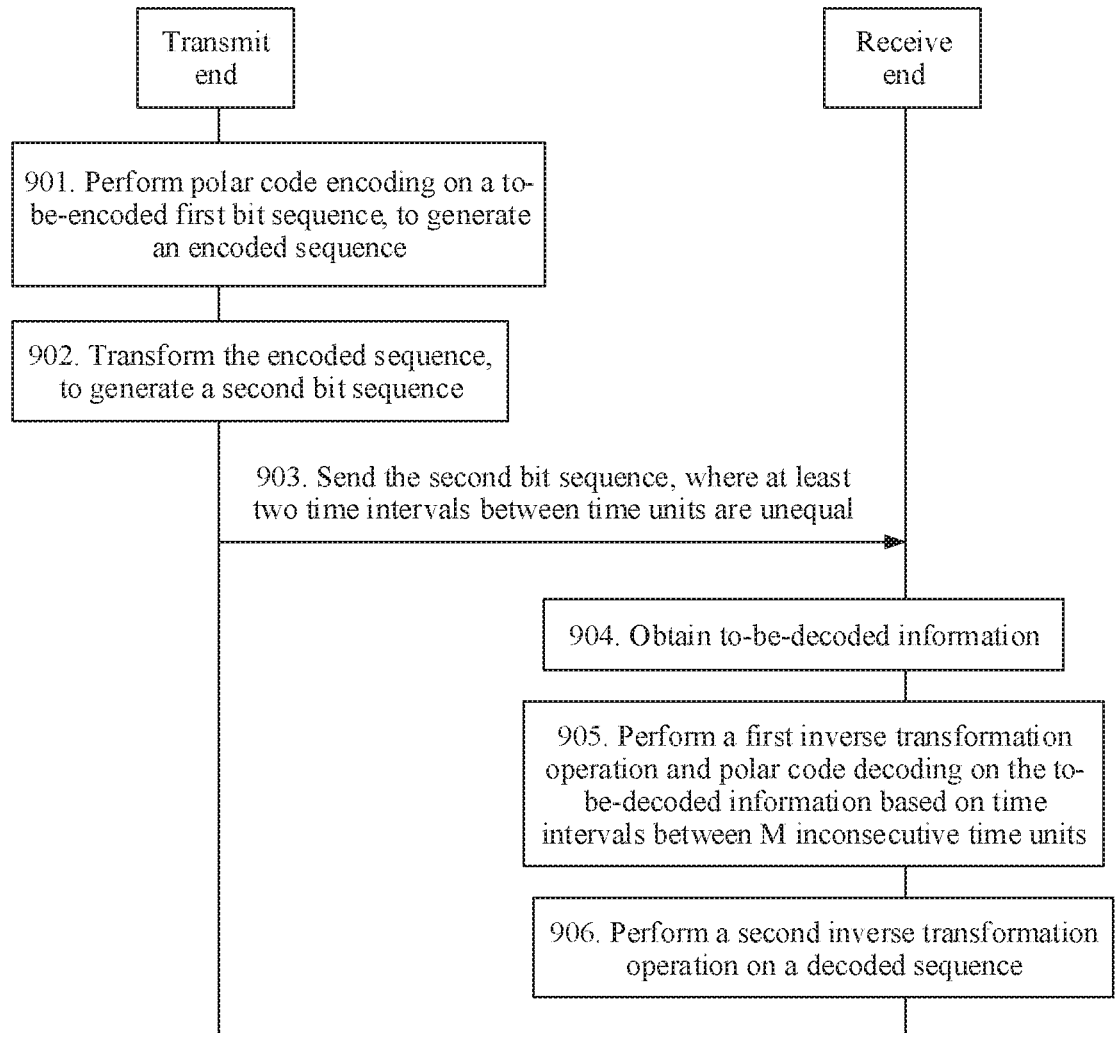
FIG. 9 is a schematic flowchart of a polar code-based transmission method according to an embodiment of this application.

As shown in FIG. 9, a specific procedure of a polar encoding method provided in an embodiment of this application is as follows:

Step 901: A transmit end performs polar encoding on a to-be-encoded first bit sequence, to generate an encoded sequence.

Step 902: The transmit end performs a transformation operation on the encoded sequence, to obtain a second bit sequence.

The transformation operation may include at least one of scrambling, interleaving, and reordering.

Step 903: The transmit end sends the second bit sequence in M inconsecutive time units, where at least two time intervals between the time units in the M inconsecutive time units are unequal.

Step 904: A receive end obtains to-be-decoded information.

Step 905: The receive end performs a first inverse transformation operation and polar code decoding on the to-be-decoded information based on time intervals between the M inconsecutive time units.

At least two time intervals between the time units in the M inconsecutive time units are unequal. The inverse transformation includes at least one of descrambling, de-interleaving, and inverse reordering.

The receive end determines, based on the time intervals between the M inconsecutive time units, a first inverse transformation amount used for a sending sequence in each time unit. The receive end performs first inverse transformation on the to-be-decoded information by using the first inverse transformation amount, and performs soft combination on sequences obtained after the first inverse transformation. The receive end performs polar code decoding on a sequence obtained after the soft combination.

Step 906: The receive end performs a second inverse transformation operation on a decoded sequence.

The receive end performs at least two levels of grouping on the decoded sequence. The receive end performs second inverse transformation on a sequence obtained after each-level grouping except $i^{th}$-level grouping. M inverse transformation amounts are used for a sequence obtained after the $i^{th}$-level grouping, and the M inverse transformation amounts are used to indicate time sequence index values of the M inconsecutive time units.

That the transformation operation is interleaving is used as an example in the following descriptions. Specifically, the transformation operation described in step 902 may be a hierarchical transformation operation, and the hierarchical transformation operation may be hierarchical interleaving. The transmit end determines a level value of the hierarchical interleaving based on a level value of a hierarchical time sequence that needs to be indicated.

A process in which the transmit end performs at least two levels of interleaving on the encoded sequence is as follows: The transmit end performs at least two levels of grouping on the encoded sequence, and transforms a sequence obtained after each-level grouping, where a transformation amount used for a sequence obtained after one level of grouping is used to indicate a time sequence index value in one level of time sequence transmission.

Two levels of interleaving is used as an example. The transmit end divides the encoded sequence into L parts during first-level grouping, and divides each part into P subparts during second-level grouping. The transmit end interleaves a sequence obtained after each-level grouping. The transmit end performs first-level interleaving on the L parts, and performs second-level interleaving on the P parts of each part. L may be equal or unequal to P. A transformation amount used for a sequence obtained after one level of grouping is used to indicate a time sequence index value in one level of time sequence transmission. A first-level interleaving manner may be used to represent first-level time sequence information, namely, a time sequence index value in first-level time sequence transmission. A second-level interleaving manner may be used to represent second-level time sequence information, namely, a time sequence index value in second-level time sequence transmission. FIG. 8a to FIG. 8d show examples of two levels of grouping.

The M inconsecutive time units are a type of transmission time sequence. A sequence number of one of the M time units is a time sequence index value. M transformation amounts are used for a sequence obtained after one of the at least two levels of grouping, and the M transformation amounts are used to indicate the time sequence index values of the M inconsecutive time units. One of the M transformation amounts may indicate a time sequence index value of one of the M inconsecutive time units. If the transformation is cyclic shift, the transformation amount is a cyclic shift value.

It should be noted that, in descriptions of this embodiment of this application, the transformation amount is a specific transformation value used for each type of transformation. For example, a cyclic shift value is used for a cyclic shift manner, and a quantity m of interleaving times is used for a progressive interleaving manner. If different transformation amounts are used, it may be considered that different interleaving manners are used. Therefore, in terms of name, the transformation amount may be considered to be equivalent to the interleaving manner. The descriptions are applicable to the entire application.

Figure 10:
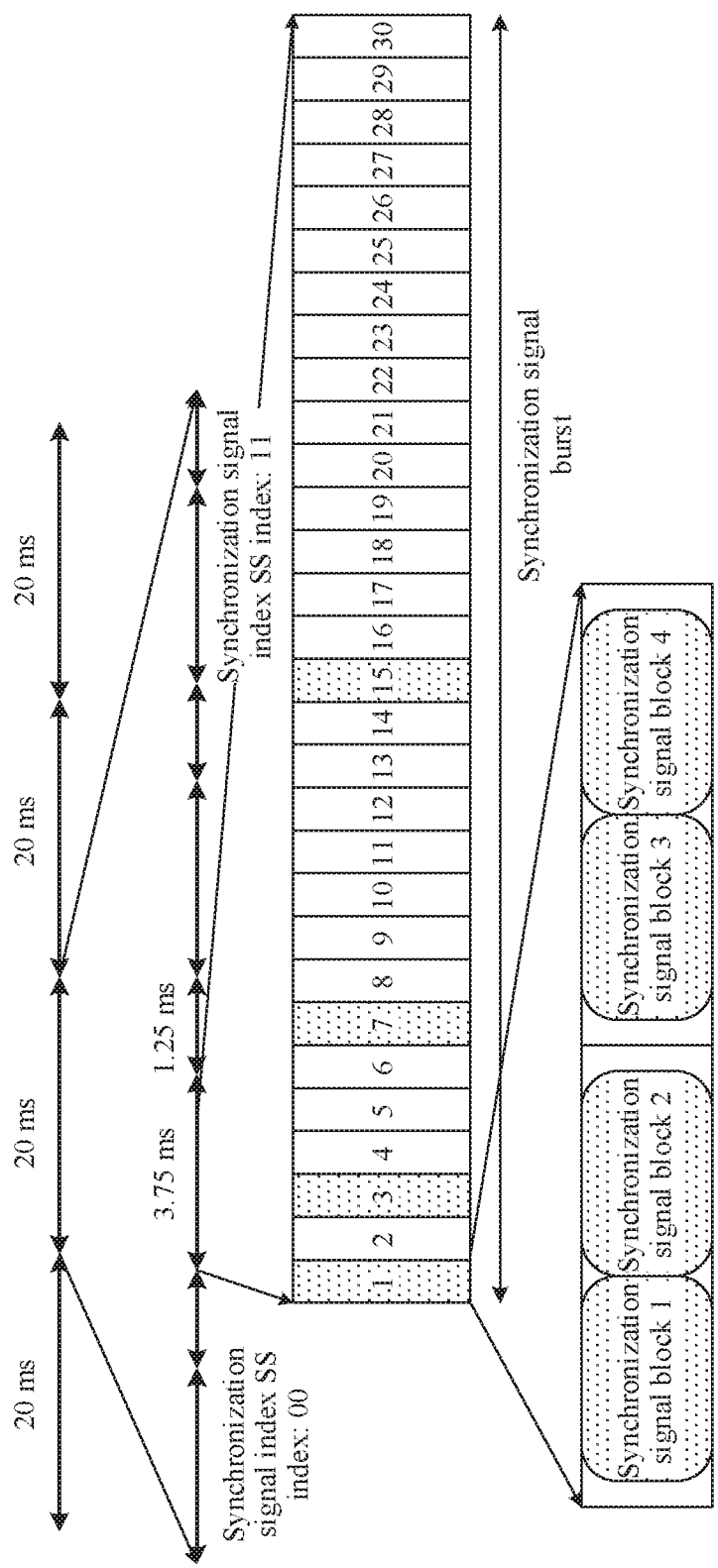
FIG. 10, FIG. 11, FIG. 12, and FIG. 14 are schematic diagrams of transmitting a hierarchical time sequence through hierarchical transformation according to embodiments of this application.

For example, as shown in FIG. 10, a typical PBCH transmission design is used as an example. A PBCH transmission period (Transmission Time Interval, TTI) is 80 ms, and broadcast information is repeated four times in the period, that is, broadcast information repeated each time can be decoded independently. Each transport block has a length of 20 ms, and one transport block includes four synchronization signal bursts (SS burst). Each SS burst has a length of 3.75 ms, and includes 30 synchronization signal segments (SS segment). Four SS segments whose sequence number indexes (index) are 1, 3, 7, and 15 in the synchronization signal segments each include four synchronization signal blocks (SS block), and the four SS blocks are distributed in two slots (slot). FIG. 10 only shows four SS blocks included in the SS segment with the sequence number 1.

The transmit end uses two levels of interleaving for an entire bit sequence of a synchronization signal block, to represent two levels of time sequence information. The transmit end divides the entire bit sequence of the synchronization signal block into four parts with a same length, and uses a first-level interleaving manner shown in each of FIG. 8a to FIG. 8d for the four parts. To be specific, cyclic shift values are respectively 0, N/4, 2N/4, and 3N/4, and there are a total of four different interleaving manners. First-level time sequence information may be implicitly carried in each first-level interleaving manner. For example, the first-level time sequence information is a sequence number of an SS segment. The transmit end divides each part into four subparts, and uses a second-level interleaving manner shown in each of FIG. 8a to FIG. 8d for the four subparts. To be specific, cyclic shift values are respectively 0, N/4, 2N/4, and 3N/4, and there are a total of four different second-level interleaving manners. Second-level time sequence information may be implicitly carried in each second-level interleaving manner. For example, the second-level time sequence information is a sequence number of an SS block. In a possible implementation, four interleaving sequences shown in FIG. 8a may be respectively used for four SS blocks sent in the SS segment with the sequence number 1; four interleaving sequences shown in FIG. 8b may be respectively used for four SS blocks sent in the SS segment with the sequence number 3; four interleaving sequences shown in FIG. 8c may be respectively used for four SS blocks sent in the SS segment with the sequence number 7; and four interleaving sequences shown in FIG. 8d may be respectively used for four SS blocks sent in the SS segment with the sequence number 15. Four time sequences 1*a*, 1*b*, 1*c*, and 1d shown in FIG. 8a respectively represent sequence numbers of the four SS blocks sent in the SS segment with the sequence number 1; four time sequences 2*a*, 2*b*, 2*c*, and 2*d* shown in FIG. 8b respectively represent sequence numbers of the four SS blocks sent in the SS segment with the sequence number 3; four time sequences 3*a*, 3*b*, 3*c*, and 3*d* shown in FIG. 8c respectively represent sequence numbers of the four SS blocks sent in the SS segment with the sequence number 7; and four time sequences 4*a*, 4*b*, 4*c*, and 4*d* shown in FIG. 8d respectively represent sequence numbers of the four SS blocks sent in the SS segment with the sequence number 15.

The receive end only needs to perform, in the first-level interleaving manner, inverse processing on signals received in different first-level time sequences, that is, perform de-interleaving processing in a first-level de-interleaving manner corresponding to the first-level interleaving manner. For example, inverse cyclic shift values at the receive end are respectively 0, N/4, 2N/4, and 3N/4.

There is a relative distance between every two first-level interleaving manners in the four first-level interleaving manners. For example, there is a difference value between every two cyclic shift values. The receive end may perform inverse interleaving based on relative distances between interleaving manners used for signals received in four first-level time sequences. A de-interleaving manner used in inverse interleaving depends on a relative distance between an interleaving manner and a reference interleaving manner. For example, a cyclic shift value 0 is used as the reference interleaving manner, and the receive end needs to perform inverse cyclic shift by N/4 on a signal received in the SS segment with the sequence number 3, perform inverse cyclic shift by 2N/4 on a signal received in the SS segment with the sequence number 7, and perform inverse cyclic shift by 3N/4 on a signal received in the SS segment with the sequence number 15. However, relative distances of interleaving manners used for signals in two adjacent first-level time sequences may be the same. Therefore, when receiving the signals in the two adjacent first-level time sequences, the receive end cannot determine a relative distance between each of the two interleaving manners and the reference interleaving manner based on the relative distances of the interleaving manners, and cannot determine a specific de-interleaving manner for use, namely, cannot determine an inverse cyclic shift value for use.

In this embodiment of this application, it is designed that at least two time intervals between time units for sending signals are unequal, and a bit sequence obtained after a transformation operation is sent in inconsecutive time units. In this way, when receiving signals sent in two time units, the receive end can determine, based on a time interval, a relative distance between a reference interleaving manner and each of interleaving manners used for the signals in the two time sequences, accurately obtain two de-interleaving manners, correctly perform de-interleaving on the signals in the two time sequences, and perform subsequent operations such as soft combination and decoding on a sequence obtained after the de-interleaving.

In this embodiment of this application, a quantity of bits of implicitly carried information may be obtained based on a quantity of transmission versions obtained through hierarchical interleaving. For example 16 transmission versions may be obtained through two levels of interleaving shown in each of FIG. 8a to FIG. 8d, and a maximum of 4-bit implicit information may be carried. For example, the 16 transmission versions respectively represent 0000, 0001, 0010, 0011, 0100, 0101, 0110, 0111, 1000, 1001, 1010, 1011, 1100, 1110, 1101, and 1111. Certainly, more transmission versions may be obtained through more levels of interleaving, and more bits of implicit information may be carried.

In this embodiment of this application, a design of a time interval between every two time units may meet the following rule.

Optionally, the M inconsecutive time units include a first time unit, a second time unit, and a third time unit that are sorted in ascending order of time sequence index values. A first time interval between the first time unit and the second time unit and a second time interval between the second time unit and the third time unit meet the following condition: the second time interval is greater than or equal to a sum of the first time interval, the first time unit, and the second time unit.

For example, in FIG. 10, it is assumed that the M inconsecutive time units are transmission time sequences at a level of an SS segment. The first time unit is the SS segment with the sequence number 1, the second time unit is the SS segment with the sequence number 3, and the third time unit is the SS segment with the sequence number 7. Because each SS segment includes four SS blocks, the first time unit has a length of 4, and the second time unit also has a length of 4. The first time interval has a length of one time unit, that is, also has a length of 4. A value of the second time interval needs to be greater than or equal to 4+4+4=12. In other words, the value of the second time interval needs to be greater than or equal to a length of three time units. In FIG. 10, the value of the second time interval is 12. Certainly, the second time interval may be a value greater than 12.

The following further describes in detail, with reference to some PBCH time sequence structures, the polar code-based transmission method provided in this embodiment of this application.

Implementation 1

Figure 11:
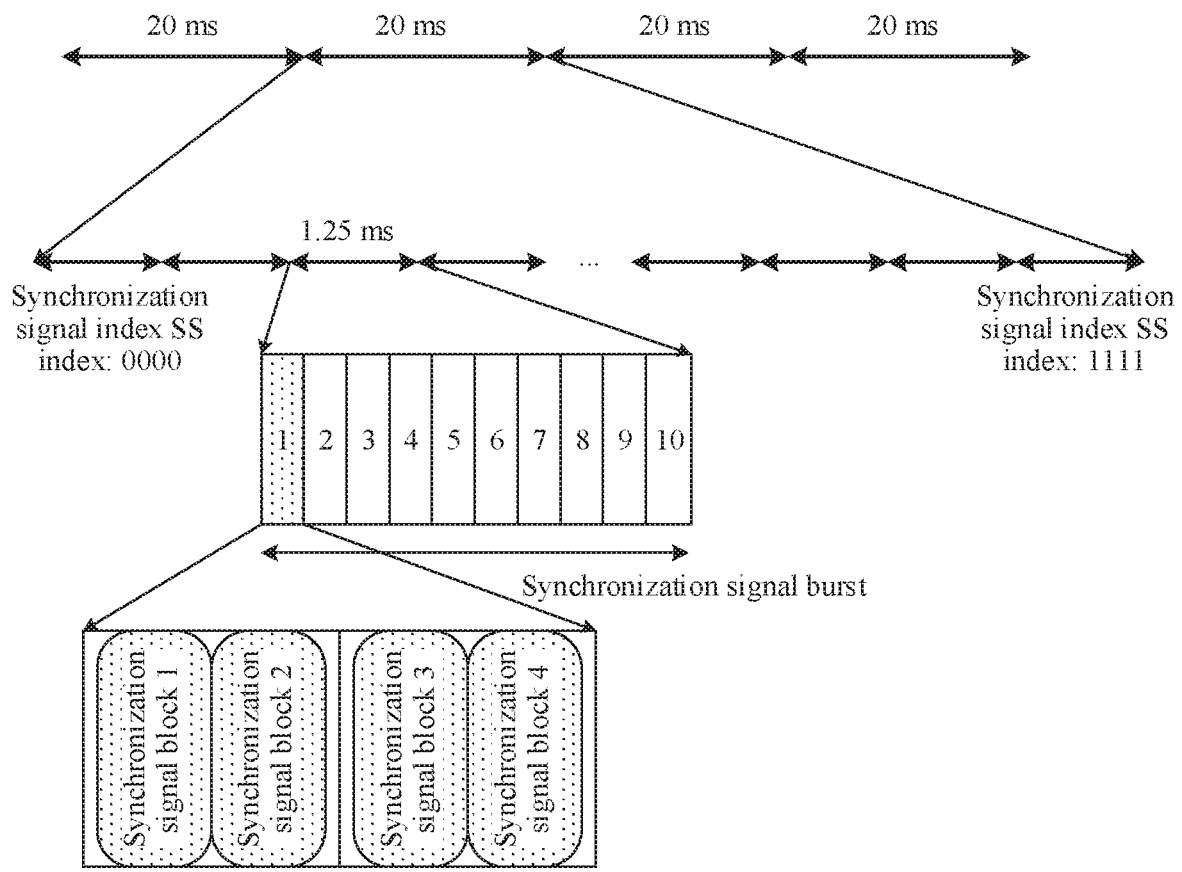

As shown in FIG. 11, a PBCH transmission period TTI is 80 ms, and broadcast information is repeated four times in the period, that is, broadcast information repeated each time can be decoded independently. Each transport block has a length of 20 ms, and includes 16 SS bursts. Each SS burst has a length of 1.25 ms, and includes 10 SS segments. An SS segment with a sequence number 1 includes four SS blocks that are distributed in two slots. Interleaving may be performed by using an interleaving process shown in FIG. 6, to obtain four versions of SS blocks, namely, the foregoing four SS blocks. The four versions may implicitly carry 2-bit information.

A system frame number SFN has a length of 10 bits. One bit of the system frame number is obtained by differentiating between odd and even frame numbers. To be specific, when SS bursts are obtained subsequently, if the first eight bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling.

Alternatively, a system frame number SFN has a length of 10 bits. One bit of the system frame number is obtained by differentiating between odd and even frame numbers. To be specific, when SS bursts are obtained subsequently, if the first eight bursts are obtained, a most significant bit of the system frame number is 0; or if the first eight bursts are obtained, a most significant bit of the system frame number is 1. 0 and 1 respectively correspond to the odd frame number and the even frame number. One bit is determined based on a secondary synchronization signal (SSS), six bits are explicitly transmitted by using the broadcast information, and two bits are implicitly transmitted. Specifically, a transmit end interleaves the SSS signal, for example, performs cyclic shift, where a cyclic shift length is half a length of the SSS signal. The SSS signal is divided into two subsequences with a same length, and orders of the two subsequences with a same length are interchanged every 5 ms. In this way, two versions of SSS signals can be generated, and the two versions can carry 1-bit implicit information. In other words, 1-bit information is implicitly carried based on the orders of the two subsequences that form the SSS signal.

Certainly, alternatively, eight bits of the system frame number may be explicitly transmitted by using the broadcast information, and two bits are implicitly transmitted. This is not limited in this embodiment of this application.

An SS index has a length of six bits. Four bits of the SS index are explicitly transmitted through the PBCH, and two bits are implicitly transmitted. The implicitly transmitted two bits are represented in an interleaving manner shown in FIG. 6.

If a receive end performs decoding based on SS blocks in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result four times, to obtain the implicitly transmitted two bits of the SS index. The explicitly transmitted four bits of the SS index and the explicitly transmitted seven bits of the SFN are obtained based on a PBCH decoding result, and the implicitly transmitted one bit of the SFN number is obtained based on the SS index.

If a receive end performs decoding based on SS blocks in different SS bursts, the receive end performs blind detection four times, to detect a sequence that is scrambled on a 20 ms transport block, so as to obtain the implicitly transmitted two bits of the SFN. Each time when blind detection is performed, blind detection polar decoding needs to be performed 16 times, and CRC detection is performed four times on a decoding result obtained each time, to obtain the implicitly transmitted two bits of the SS index. The explicitly transmitted four bits of the SS index and the explicitly transmitted seven bits of the SFN are obtained based on a PBCH decoding result, and the implicitly transmitted one bit of the SFN number is obtained based on the SS index.

Implementation 2

Figure 12:
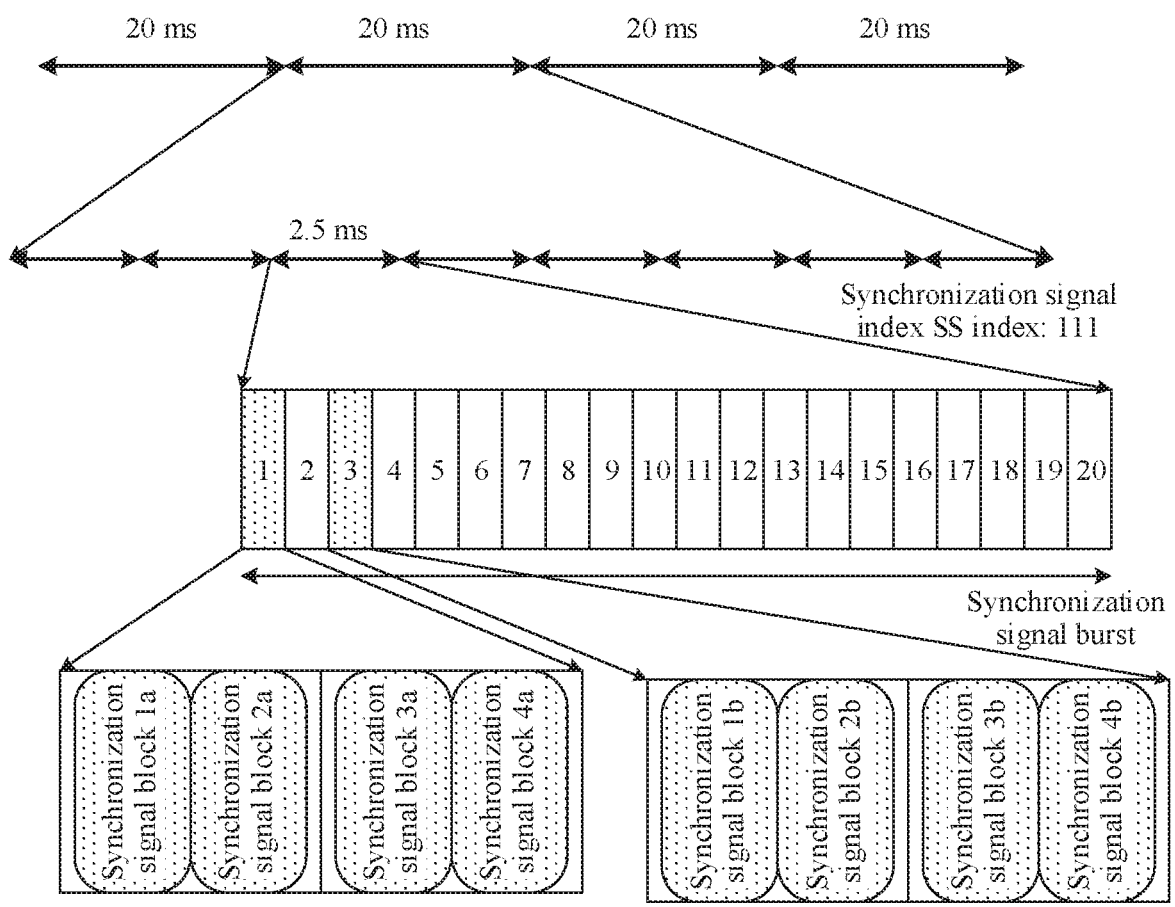
Figure 13A:
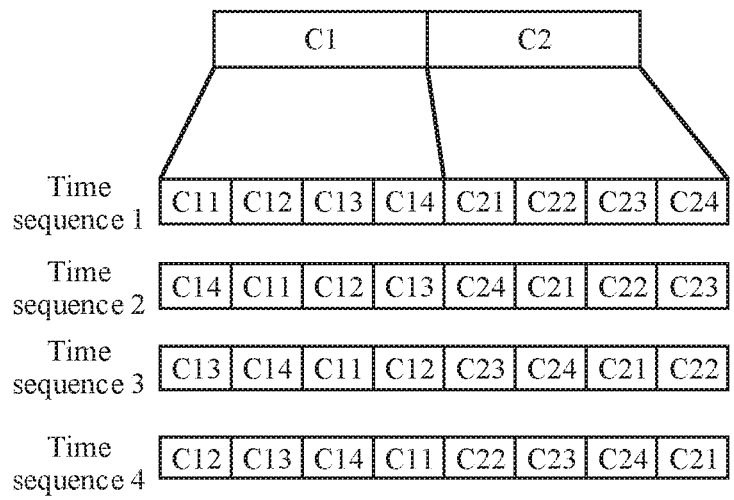
FIG. 13*a* and FIG. 13*b* are schematic diagrams 2 of hierarchical interleaving processes according to embodiments of this application.
Figure 13B:
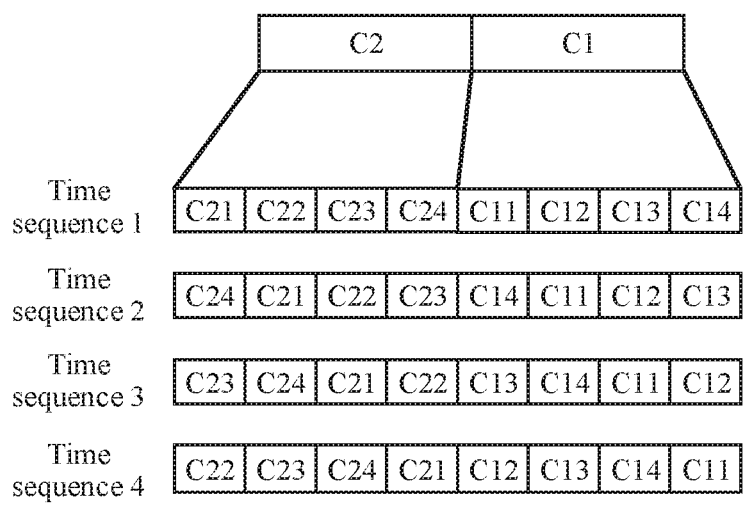

As shown in FIG. 12, a PBCH transmission period TTI is 80 ms, and broadcast information is repeated four times in the period, that is, broadcast information repeated each time can be decoded independently. Each transport block has a length of 20 ms, and includes eight SS bursts. Each SS burst has a length of 2.5 ms, and includes 20 SS segments. SS segments with sequence numbers 1 and 3 each include four SS blocks, and every four SS blocks are distributed in two slots. A transmit end may perform interleaving by using a two levels of interleaving process shown in each of FIG. 13a and FIG. 13b. The transmit end divides an encoded sequence into two parts with a same length, and performs first-level interleaving on the two parts by using a first-level interleaving process shown in each of FIG. 13a and FIG. 13b. Each first-level interleaving manner may represent a specific value of a first-level time sequence, for example, represent a sequence number of an SS segment. The transmit end divides each part into four subparts with a same length, and performs second-level interleaving on the four subparts by using a second-level interleaving process shown in each of FIG. 13a and FIG. 13b. Each second-level interleaving manner may represent a specific value of a second-level time sequence, for example, represent a sequence number of an SS block in an SS segment. In this way, eight versions of SS blocks, namely, the eight SS blocks shown in FIG. 12, can be generated. The eight versions may implicitly carry 3-bit information.

A system frame number SFN has a length of 10 bits. One bit of the system frame number is obtained by differentiating between odd and even frame numbers. To be specific, when SS bursts are obtained subsequently, if the first four bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling. Certainly, alternatively, eight bits of the system frame number may be explicitly transmitted by using the broadcast information, and two bits are implicitly transmitted. This is not limited in this embodiment of this application.

An SS index has a length of six bits. Three bits of the SS index are explicitly transmitted through the PBCH, and three bits are implicitly transmitted. The implicitly transmitted three bits of the SS index are represented in an interleaving manner shown in each of FIG. 13a and FIG. 13b.

If a receive end performs decoding based on SS blocks of different SS segments in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result four times, to obtain the implicitly transmitted three bits of the SS index. The explicitly transmitted three bits of the SS index and the explicitly transmitted seven bits of the SFN are obtained based on a PBCH decoding result, and the implicitly transmitted one bit of the SFN number is obtained based on the SS index.

If a receive end performs decoding based on SS blocks of different SS segments in different SS bursts, the receive end performs blind detection four times, to detect a sequence that is scrambled on a 20 ms transport block, so as to obtain the implicitly transmitted two bits of the SFN. Each time when blind detection is performed, blind detection polar decoding needs to be performed eight times, and CRC detection is performed four times on a decoding result obtained each time, to obtain the implicitly transmitted three bits of the SS index. The explicitly transmitted three bits of the SS index and the explicitly transmitted seven bits of the SFN are obtained based on a PBCH decoding result, and the implicitly transmitted one bit of the SFN number is obtained based on the SS index.

Implementation 3

As shown in FIG. 10, a PBCH transmission period TTI is 80 ms, and broadcast information is repeated four times in the period, that is, broadcast information repeated each time can be decoded independently. Each transport block has a length of 20 ms, and includes four SS bursts. An SS burst has a length of 3.75 ms, and includes 30 SS segments. Four SS segments with sequence numbers 1, 3, 7, and 15 each include four SS blocks, and every four SS blocks are distributed in two slots. A transmit end performs interleaving by using a two levels of interleaving process in each of FIG. 8a to 8d. The transmit end divides an encoded sequence into four parts with a same length, and performs first-level interleaving on the four parts by using a first-level interleaving process shown in each of FIG. 8a to FIG. 8d. Each first-level interleaving manner may represent a specific value of a first-level time sequence, for example, represent a sequence number of an SS segment. The transmit end divides each part into four subparts with a same length, and performs second-level interleaving on the four subparts by using a second-level interleaving process shown in each of FIG. 8a to FIG. 8d. Each second-level interleaving manner may represent a specific value of a second-level time sequence, for example, represent a sequence number of an SS block in an SS segment. In this way, 16 versions of SS blocks, namely, the 16 SS blocks shown in FIG. 10, can be generated. The 16 versions may implicitly carry 4-bit information.

A system frame number SFN has a length of 10 bits. One bit of the system frame number is obtained by differentiating between odd and even frame numbers. To be specific, when SS bursts are obtained subsequently, if the first two bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling. Certainly, alternatively, eight bits of the system frame number may be explicitly transmitted by using the broadcast information, and two bits are implicitly transmitted. This is not limited in this embodiment of this application.

An SS index has a length of six bits, two bits of the SS index are explicitly transmitted through the PBCH, and four bits are implicitly transmitted. The implicitly transmitted four bits of the SS index are represented in an interleaving manner shown in each of FIG. 8a to FIG. 8d.

If a receive end performs decoding based on SS blocks of a same SS segment in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result 16 times, to obtain the implicitly transmitted four bits of the SS index. The explicitly transmitted two bits of the SS index and the explicitly transmitted seven bits of the SFN are obtained based on a PBCH decoding result, and the implicitly transmitted one bit of the SFN number is obtained based on the SS index.

If a receive end performs decoding based on SS blocks of different SS segments in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result four times, to obtain the implicitly transmitted four bits of the SS index.

The explicitly transmitted two bits of the SS index and the explicitly transmitted seven bits of the SFN are obtained based on a PBCH decoding result, and the implicitly transmitted one bit of the SFN is obtained based on the SS index.

If a receive end performs decoding based on SS blocks of different SS segments in different SS bursts, the receive end performs blind detection four times, to detect a sequence that is scrambled on a 20 ms transport block, so as to obtain the implicitly transmitted two bits of the SFN. Each time when blind detection is performed, polar decoding needs to be performed four times, and CRC detection is performed four times on a decoding result obtained each time, to obtain the implicitly transmitted four bits of the SS index.

The explicitly transmitted two bits of the SS index and the explicitly transmitted seven bits of the SFN are obtained based on a PBCH decoding result, and the implicitly transmitted one bit of the SFN number is obtained based on the SS index.

Implementation 4

Figure 14:
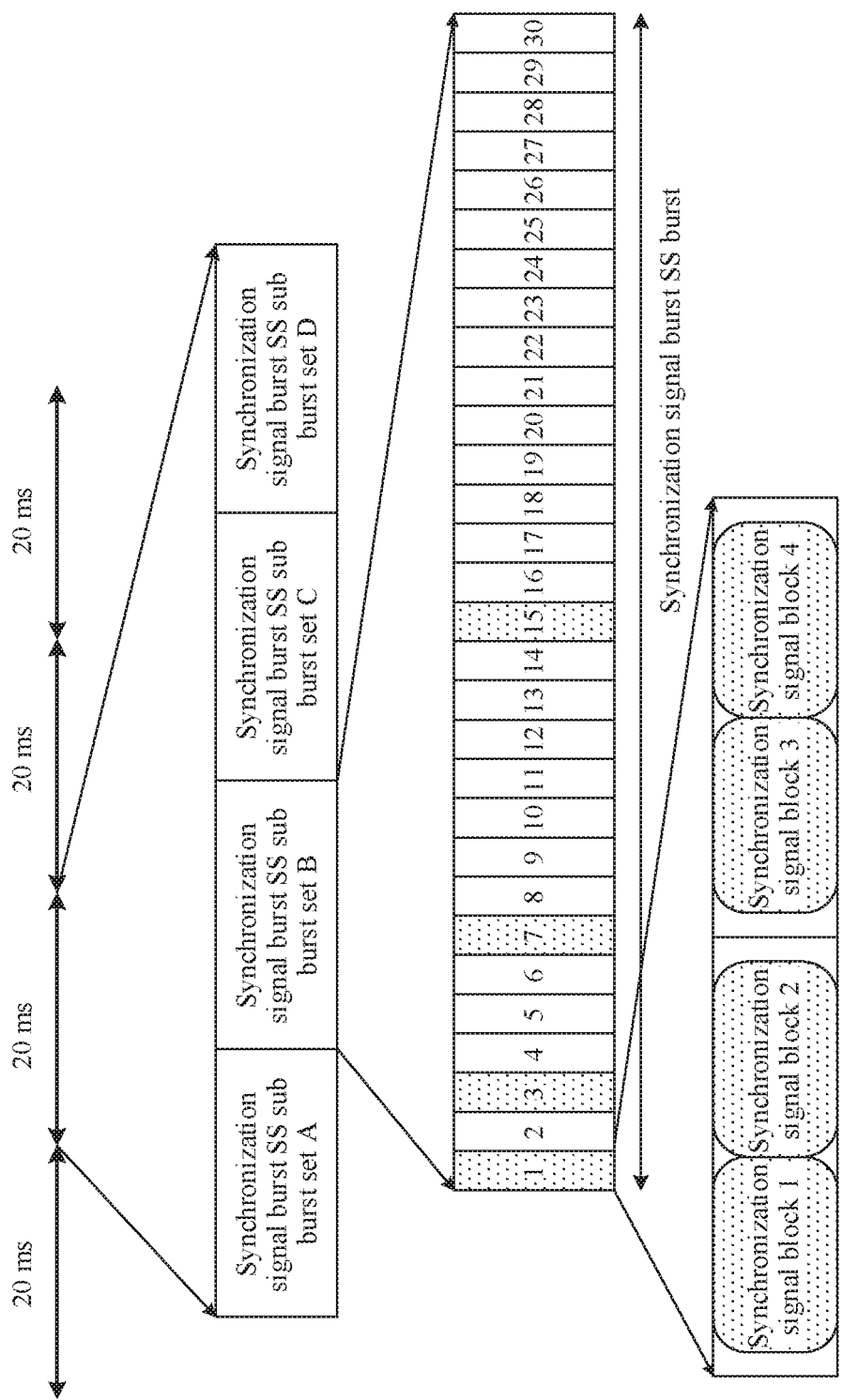

As shown in FIG. 14, a PBCH transmission period TTI is 80 ms, and broadcast information is repeated four times in the period, that is, broadcast information repeated each time can be decoded independently. Each transport block has a length of 20 ms, and includes four SS sub burst sets. Each SS sub burst set includes 30 SS segments. Four SS segments with sequence numbers 1, 3, 7, and 15 each include four SS blocks, and every four SS blocks are distributed in two slots. A transmit end may perform interleaving by using a three-level interleaving process. The transmit end divides an encoded sequence into four parts with a same length, and performs first-level interleaving on the four parts by using a first-level interleaving process. Each first-level interleaving manner may represent a specific value of a first-level time sequence, for example, represent a sequence number of an SS sub burst set. The transmit end divides each part into four first-subparts with a same length, and performs second-level interleaving on the four first-subparts by using a second-level interleaving process. Each second-level interleaving manner may represent a specific value of a second-level time sequence, for example, represent a sequence number of an SS segment in an SS sub burst set. The transmit end divides each first subpart into four second-subparts with a same length, and performs third-level interleaving on the four second-subparts by using a third-level interleaving process. Each third-level interleaving manner may represent a specific value of a third-level time sequence, for example, represent a sequence number of an SS block in an SS segment. In this way, 64 versions of SS blocks can be generated. The 64 versions may implicitly carry 6-bit information.

A system frame number SFN has a length of 10 bits. One bit of the system frame number is obtained by differentiating between odd and even frame numbers. To be specific, when SS bursts are obtained subsequently, if the first eight bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling. Certainly, alternatively, eight bits of the system frame number may be explicitly transmitted by using the broadcast information, and two bits are implicitly transmitted. This is not limited in this embodiment of this application.

An SS index has a length of six bits. The six bits of the SS index may be all implicitly transmitted.

If a receive end performs decoding based on SS blocks of a same SS segment in a same SS burst in a same SS sub burst set, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed 64 times on a decoding result obtained each time, to obtain the implicitly transmitted six bits of the SS index. The explicitly transmitted seven bits of the SFN are obtained based on a PBCH decoding result, and the implicitly transmitted one bit of the SFN number is obtained based on the SS index.

Implementation 5

As shown in FIG. 14, a PBCH transmission period TTI is 80 ms, and broadcast information is repeated four times in the period, that is, broadcast information repeated each time can be decoded independently. Each transport block has a length of 20 ms, and includes 20 SS bursts. Each SS burst has a length of 1 ms, and includes six SS segments. SS segments with sequence numbers 1 and 3 each include four SS blocks, and every four SS blocks are distributed in two slots. A transmit end may perform interleaving by using a two levels of interleaving process shown in each of FIG. 13*a* and FIG. 13*b*. The transmit end divides an encoded sequence into two parts with a same length, and performs first-level interleaving on the two parts by using a first-level interleaving process shown in each of FIG. 13*a* and FIG. 13*b*. Each first-level interleaving manner may represent a specific value of a first-level time sequence, for example, represent a sequence number of an SS segment. The transmit end divides each part into four subparts with a same length, and performs second-level interleaving on the four subparts by using a second-level interleaving process shown in each of FIG. 13*a* and FIG. 13*b*. Each second-level interleaving manner may represent a specific value of a second-level time sequence, for example, represent a sequence number of an SS block in an SS segment. In this way, eight versions of SS blocks can be generated. The eight versions may implicitly carry 3-bit information.

If the transmit end needs to send 64 SS blocks, the transmit end completes transmission of the 64 SS blocks in the first 8 ms.

A system frame number SFN has a length of 10 bits. One bit of the system frame number is obtained by differentiating between odd and even frame numbers. To be specific, when SS bursts are obtained subsequently, if the first ten bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling. Certainly, alternatively, eight bits of the system frame number may be explicitly transmitted by using the broadcast information, and two bits are implicitly transmitted. This is not limited in this embodiment of this application.

An SS index has a length of six bits. Three bits of the SS index are explicitly transmitted through the PBCH, and three bits are implicitly transmitted. The implicitly transmitted three bits of the SS index are represented in an interleaving manner shown in each of FIG. 13*a* and FIG. 13*b*.

If a receive end performs decoding based on SS blocks of different SS segments in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result four times, to obtain the implicitly transmitted three bits of the SS index. The explicitly transmitted three bits of the SS index and the explicitly transmitted seven bits of the SFN are obtained based on a PBCH decoding result, and the implicitly transmitted one bit of the SFN number is obtained based on the SS index.

If a receive end performs decoding based on SS blocks of different SS segments in different SS bursts, the receive end performs blind detection four times, to detect a sequence that is scrambled on a 20 ms transport block, so as to obtain the implicitly transmitted two bits of the SFN. Each time when blind detection is performed, polar decoding needs to be performed eight times, and CRC detection is performed four times on a decoding result obtained each time, to obtain the implicitly transmitted three bits of the SS index. The explicitly transmitted three bits of the SS index and the explicitly transmitted seven bits of the SFN are obtained based on a PBCH decoding result, and the implicitly transmitted one bit of the SFN number is obtained based on the SS index.

Implementation 6

As shown in FIG. 10, a PBCH transmission period TTI is 80 ms, and broadcast information is repeated four times in the period, that is, broadcast information repeated each time can be decoded independently. Each transport block has a length of 20 ms, and includes four SS bursts. An SS burst has a length of 3.75 ms, and includes 30 SS segments. Four SS segments with sequence numbers 1, 3, 7, and 15 each include four SS blocks, and every four SS blocks are distributed in two slots. A transmit end performs interleaving by using a two levels of interleaving process in each of FIG. 8*a* to 8*d*. The transmit end indicates time sequence information of an SS burst and time sequence information of an SS block through two levels of interleaving. Time sequence information of an SS segment is explicitly transmitted through the PBCH. The transmit end divides an encoded sequence into four parts with a same length, and performs first-level interleaving on the four parts by using a first-level interleaving process shown in each of FIG. 8*a* to FIG. 8*d*. Each first-level interleaving manner may represent a specific value of a first-level time sequence, for example, represent a sequence number of an SS burst. The transmit end divides each part into four subparts with a same length, and performs second-level interleaving on the four subparts by using a second-level interleaving process shown in each of FIG. 8*a* to FIG. 8*d*. Each second-level interleaving manner may represent a specific value of a second-level time sequence, for example, represent a sequence number of an SS block in an SS segment. In this way, 16 versions of SS blocks, namely, the 16 SS blocks shown in FIG. 10, can be generated. The 16 versions may implicitly carry 4-bit information.

A system frame number SFN has a length of 10 bits. One bit of the system frame number is obtained by differentiating between odd and even frame numbers. To be specific, when SS bursts are obtained subsequently, if the first eight bursts are obtained, a most significant bit of the system frame number is 0; or if the first eight bursts are obtained, a most significant bit of the system frame number is 1. 0 and 1 respectively correspond to the odd frame number and the even frame number. Seven bits of the system frame number are explicitly transmitted by using the broadcast information, and two bits are implicitly transmitted. The two bits of the system frame number may be implicitly transmitted through LTE scrambling. Certainly, alternatively, eight bits of the system frame number may be explicitly transmitted by using the broadcast information, and two bits are implicitly transmitted. This is not limited in this embodiment of this application.

An SS index has a length of six bits, two bits of the SS index are explicitly transmitted through the PBCH, and four bits are implicitly transmitted. The implicitly transmitted four bits of the SS index are represented in an interleaving manner shown in each of FIG. 8a to FIG. 8d.

If a receive end performs decoding based on SS blocks of a same SS segment in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result 16 times, to obtain the implicitly transmitted four bits of the SS index. The explicitly transmitted two bits of the SS index and the explicitly transmitted seven bits of the SFN are obtained based on a PBCH decoding result, and the implicitly transmitted one bit of the SFN number is obtained based on the SS index.

If a receive end performs decoding based on SS blocks of different SS segments in a same SS burst, the receive end performs blind detection four times, to detect a sequence that is scrambled on a 20 ms transport block, so as to obtain the implicitly transmitted two bits of the SFN. Each time when blind detection is performed, polar decoding needs to be performed one time, and CRC detection is performed on a decoding result four times, to obtain the implicitly transmitted four bits of the SS index.

The explicitly transmitted two bits of the SS index and the explicitly transmitted seven bits of the SFN are obtained based on a PBCH decoding result, and the implicitly transmitted one bit of the SFN is obtained based on the SS index.

If a receive end performs decoding based on SS blocks of different SS segments in different SS bursts, the receive end performs blind detection four times, to detect a sequence that is scrambled on a 20 ms transport block, so as to obtain the implicitly transmitted two bits of the SFN. Each time when blind detection is performed, polar decoding needs to be performed four times, and CRC detection is performed four times on a decoding result obtained each time, to obtain the implicitly transmitted four bits of the SS index.

The explicitly transmitted two bits of the SS index and the explicitly transmitted seven bits of the SFN are obtained based on a PBCH decoding result, and the implicitly transmitted one bit of the SFN number is obtained based on the SS index.

Figure 15:
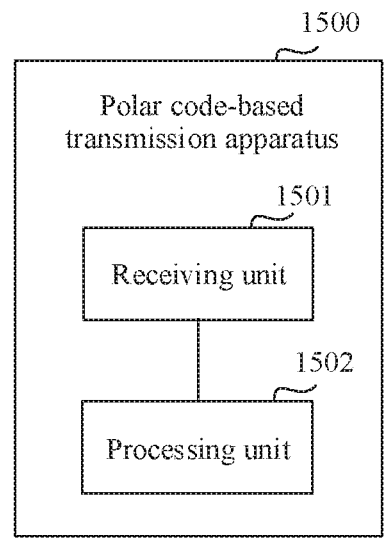
FIG. 15 to FIG. 22 are schematic structural diagrams of polar code-based transmission apparatuses according to embodiments of this application.

Based on a same inventive concept as the polar code-based transmission method shown in FIG. 9, as shown in FIG. 15, an embodiment of this application further provides a polar code-based transmission apparatus 1500. The polar code-based transmission apparatus 1500 is configured to perform the polar code-based transmission method shown in FIG. 9. The polar code-based transmission apparatus 1500 includes:

a receiving unit 1501, configured to obtain a to-be-encoded first bit sequence; and a processing unit 1502, configured to perform polar encoding on the to-be-encoded first bit sequence, to generate an encoded sequence.

The processing unit 1502 is configured to perform a transformation operation on the encoded sequence, to obtain a second bit sequence, where the transformation operation includes at least one of scrambling, interleaving, and reordering.

The processing unit 1502 is configured to send the second bit sequence in M inconsecutive time units, where at least two time intervals between the time units in the M inconsecutive time units are unequal.

Optionally, the M inconsecutive time units include a first time unit, a second time unit, and a third time unit that are sorted in ascending order of time sequence index values.

A first time interval between the first time unit and the second time unit and a second time interval between the second time unit and the third time unit meet the following condition: the second time interval is greater than or equal to a sum of the first time interval, the first time unit, and the second time unit.

Optionally, the processing unit 1502 is configured to: perform at least two levels of grouping on the encoded sequence; and transform a sequence obtained after each-level grouping, wherein a transformation amount used to transform the sequence obtained after one level of grouping is used to indicate a time sequence index value in one level of time sequence transmission.

Optionally, M transformation amounts are used for a sequence obtained after one of the at least two levels of grouping, and the M transformation amounts are used to indicate time sequence index values of the M inconsecutive time units.

Optionally, a time interval between two time units is used to indicate a manner in which a receive end performs soft combination on signals received in the two time units.

Optionally, the time interval between the two time units is used to indicate respective time sequence indexes of the two time units.

Optionally, the transformation operation is cyclic shift.

Figure 16:
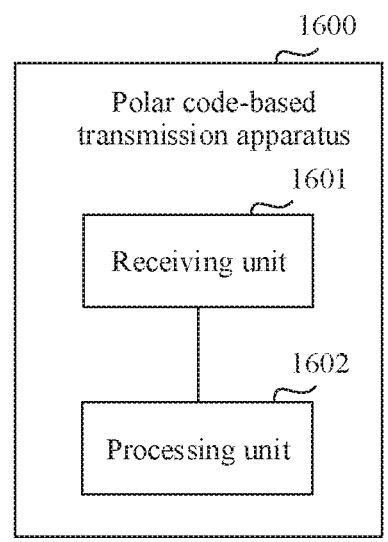

Based on a same inventive concept as the polar code-based transmission method shown in FIG. 9, as shown in FIG. 16, an embodiment of this application further provides a polar code-based transmission apparatus 1600. The polar code-based transmission apparatus 1600 is configured to perform the polar code-based transmission method shown in FIG. 9. The polar code-based transmission apparatus 1600 includes:

a receiving unit 1601, configured to obtain to-be-decoded information; and a processing unit 1602, configured to perform a first inverse transformation operation and polar code decoding on the to-be-decoded information based on time intervals between M inconsecutive time units, where at least two time intervals between the time units in the M inconsecutive time units are unequal, and the inverse transformation operation includes at least one of descrambling, de-interleaving, and inverse reordering.

The processing unit 1602 is configured to perform a second inverse transformation operation on a decoded sequence.

Optionally, the M inconsecutive time units include a first time unit, a second time unit, and a third time unit that are sorted in ascending order of time sequence index values.

A first time interval between the first time unit and the second time unit and a second time interval between the second time unit and the third time unit meet the following condition: the second time interval is greater than or equal to a sum of the first time interval, the first time unit, and the second time unit.

Optionally, the processing unit 1602 is configured to:

perform at least two levels of grouping on the decoded sequence; and perform second inverse transformation on a sequence obtained after each-level grouping except $i^{th}$-level grouping, where M inverse transformation amounts are used for a sequence obtained after the $i^{th}$-level grouping, and the M inverse transformation amounts are used to indicate time sequence index values of the M inconsecutive time units.

Optionally, the processing unit 1602 is configured to:

determine, based on the time intervals between the M inconsecutive time units, a first inverse transformation amount used for a sending sequence in each time unit;

perform first inverse transformation on the to-be-decoded information by using the first inverse transformation amount, and perform soft combination on sequences obtained after the first inverse transformation; and perform polar code decoding on a sequence obtained after the soft combination.

Optionally, the inverse transformation operation is cyclic shift.

Figure 17:
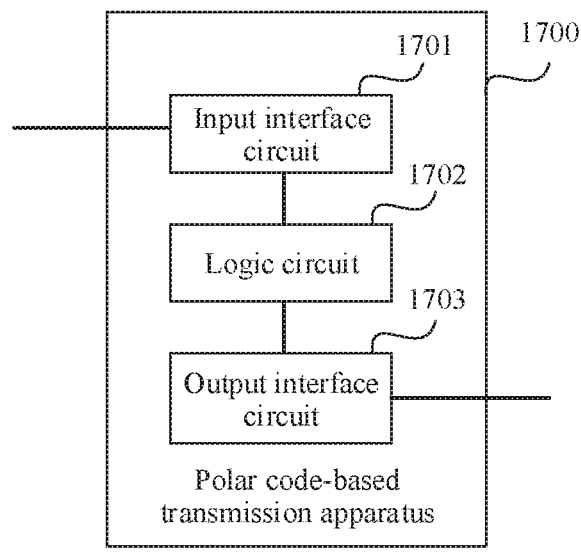

Based on a same inventive concept as the polar code-based transmission method shown in FIG. 9, as shown in FIG. 17, an embodiment of this application further provides a polar code-based transmission apparatus 1700. The polar code-based transmission apparatus 1700 is configured to perform an encoding-side method in the polar code-based transmission method shown in FIG. 9. A part or all of the polar code-based transmission method in the foregoing embodiment may be implemented by using hardware or software. When a part or all of the polar code-based transmission method is implemented by using hardware, the polar code-based transmission apparatus 1700 includes: an input interface circuit 1701, configured to obtain a to-be-encoded first bit sequence; a logic circuit 1702, configured to perform the polar code-based transmission method shown in FIG. 9, where for details, reference is made to descriptions in the foregoing method embodiment, and details are not described herein again; and an output interface circuit 1703, configured to output a second bit sequence.

Optionally, during specific implementation, the polar code-based transmission apparatus 1700 may be a chip or an integrated circuit.

Figure 18:
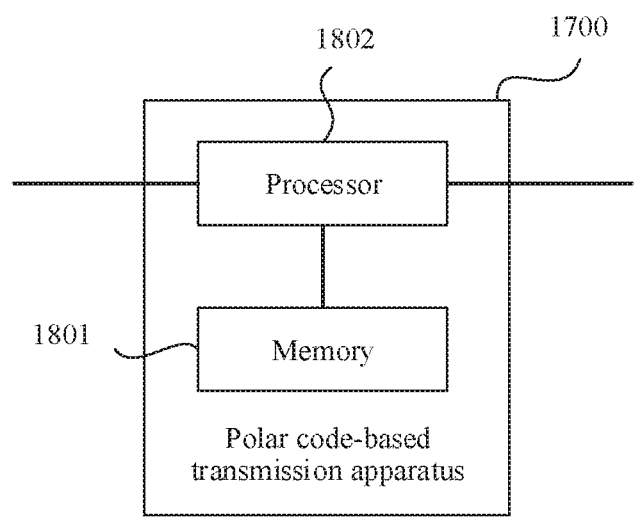

Optionally, when a part or all of the polar code-based transmission method in the foregoing embodiment is implemented by using software, as shown in FIG. 18, the polar code-based transmission apparatus 1700 includes: a memory 1801, configured to store a program; and a processor 1802, configured to execute the program stored in the memory 1801. When the program is executed, the polar code-based transmission apparatus 1700 may be enabled to implement the polar code-based transmission method provided in the foregoing embodiment.

Figure 19:
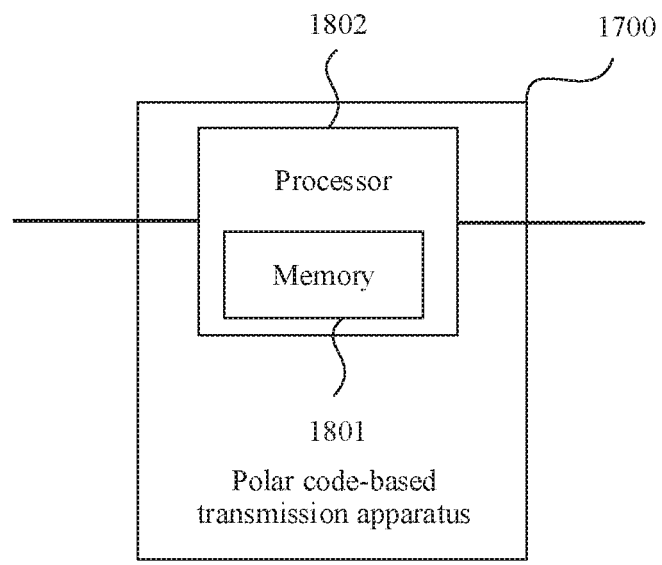

Optionally, the memory 1801 may be a physically independent unit. Alternatively, as shown in FIG. 19, the memory 1801 may be integrated with the processor 1802.

Optionally, when a part or all of the encoding method in the foregoing embodiment is implemented by using software, the polar code-based transmission apparatus 1700 may include only a processor 1802. A memory 1801 configured to store a program is located outside the polar code-based transmission apparatus 1700. The processor 1802 is connected to the memory 1801 by using a circuit wire, and is configured to read and execute the program stored in the memory 1801.

Figure 20:
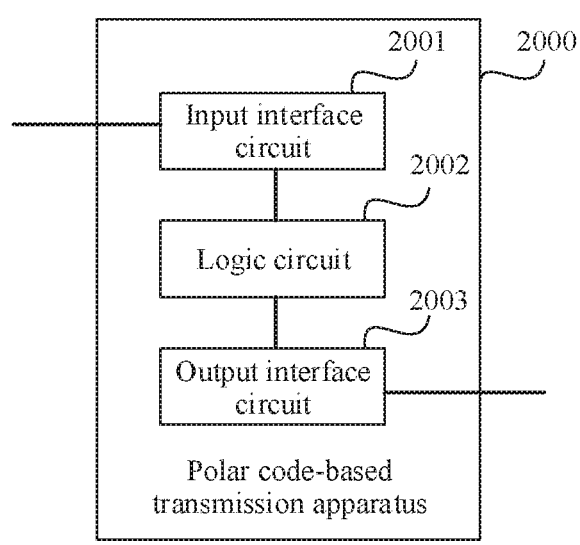

Based on a same inventive concept as the polar code-based transmission method shown in FIG. 9, as shown in FIG. 20, an embodiment of this application further provides a polar code-based transmission apparatus 2000. The polar code-based transmission apparatus 2000 is configured to perform a decoding-side method in the polar code-based transmission method shown in FIG. 9. A part or all of the polar code-based transmission method in the foregoing embodiment may be implemented by using hardware or software. When a part or all of the polar code-based transmission method is implemented by using hardware, the polar code-based transmission apparatus 2000 includes: an input interface circuit 2001, configured to obtain to-be-decoded information; a logic circuit 2002, configured to perform the decoding-side method in the polar code-based transmission method shown in FIG. 9, where for details, reference is made to descriptions in the foregoing method embodiment, and details are not described herein again; and an output interface circuit 2003, configured to output a bit sequence obtained after polar code decoding.

Optionally, during specific implementation, the polar code-based transmission apparatus 2000 may be a chip or an integrated circuit.

Figure 21:
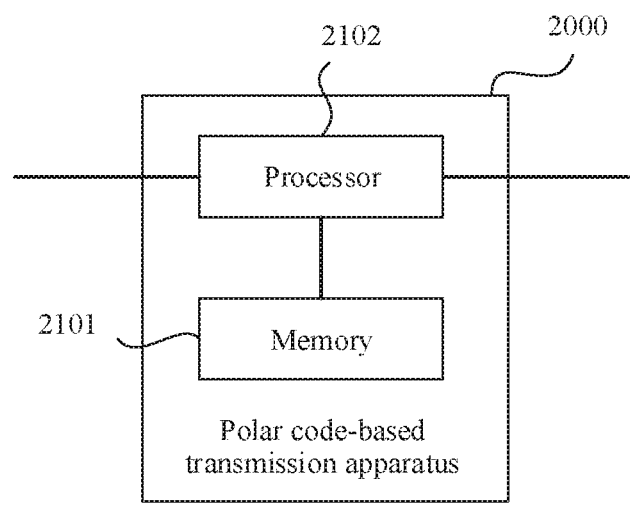

Optionally, when a part or all of the polar code-based transmission method in the foregoing embodiment is implemented by using software, as shown in FIG. 21, the polar code-based transmission apparatus 2000 includes: a memory 2101, configured to store a program; and a processor 2102, configured to execute the program stored in the memory 2101. When the program is executed, the polar code-based transmission apparatus 2000 may be enabled to implement the polar code-based transmission method provided in the foregoing embodiment.

Figure 22:
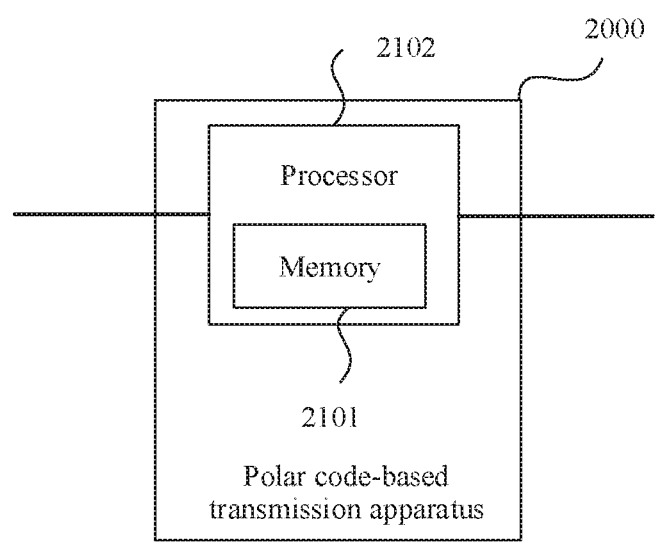

Optionally, the memory 2101 may be a physically independent unit. Alternatively, as shown in FIG. 22, the memory 2101 may be integrated with the processor 2102.

Optionally, when a part or all of the encoding method in the foregoing embodiment is implemented by using software, the polar code-based transmission apparatus 2000 may include only a processor 2102. A memory 2101 configured to store a program is located outside the polar code-based transmission apparatus 2000. The processor 2102 is connected to the memory 2101 by using a circuit/wire, and is configured to read and execute the program stored in the memory 2101.

An embodiment of this application provides a computer storage medium, configured to store a computer program. The computer program includes an instruction used to perform the polar code-based transmission method shown in FIG. 9.

An embodiment of this application provides a computer program product including an instruction. When the computer program product is run on a computer, the computer is enabled to perform the polar code-based transmission shown in method FIG. 9.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer usable storage media (including but not limited to a magnetic disk storage, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by a computer or the processor of the another programmable data processing device generate an apparatus for implementing a specific function in one or more processes in the flowcharts and/or in one or more blocks in the block diagrams.

These computer program instructions may be stored in a computer readable memory that can instruct a computer or another programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be alternatively loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as covering the preferred embodiments and all changes and modifications falling within the scope of this application.

Apparently, persons skilled in the art can make various modifications and variations to the embodiments of this application without departing from the scope of the embodiments of this application. This application is intended to cover these modifications and variations to the embodiments of this application, provided that these modifications and variations fall within the scope defined in the claims of this application and equivalent technologies thereof.

The invention claimed is:

1. A polar code transmission method, comprising:
   performing, by a transmit end, polar encoding on a to-be-encoded first bit sequence, to generate an encoded sequence;
   performing, by the transmit end, a transformation operation on the encoded sequence, to obtain a second bit sequence, wherein the transformation operation comprises at least one of scrambling, interleaving, or reordering; and
   sending, by the transmit end, the second bit sequence in M inconsecutive time units, wherein at least two time intervals between the time units in the M inconsecutive time units are unequal.

2. The method according to claim 1, wherein the M inconsecutive time units comprise a first time unit, a second time unit, and a third time unit that are sorted in ascending order of time sequence index values; and
   wherein a first time interval between the first time unit and the second time unit and a second time interval between the second time unit and the third time unit meet the following condition: the second time interval is greater than or equal to a sum of the first time interval, the first time unit, and the second time unit.

3. The method according to claim 1, wherein the performing, by the transmit end, a transformation operation on the encoded sequence comprises:
   performing, by the transmit end, at least two levels of grouping on the encoded sequence; and
   transforming, by the transmit end, a sequence obtained after each-level grouping, wherein a transformation amount used to transform the sequence obtained after one level of grouping is used to indicate a time sequence index value in one level of time sequence transmission.

4. The method according to claim 3, wherein M transformation amounts are used for a sequence obtained after one of the at least two levels of grouping, and wherein the M transformation amounts are used to indicate time sequence index values of the M inconsecutive time units.

5. The method according to claim 1, wherein a time interval between two time units is used to indicate a manner in which a receive end performs soft combination on signals received in the two time units.

6. The method according to claim 1, wherein the time interval between the two time units is used to indicate respective time sequence indexes of the two time units.

7. A polar code transmission method, comprising:
   obtaining, by a receive end, to-be-decoded information;
   performing, by the receive end, a first inverse transformation operation and polar code decoding on the to-be-decoded information based on time intervals between M inconsecutive time units, wherein at least two time intervals between the time units in the M inconsecutive time units are unequal, and wherein the inverse transformation operation comprises at least one of descrambling, de-interleaving, or inverse reordering; and
   performing, by the receive end, a second inverse transformation operation on a decoded sequence.

8. The method according to claim 7, wherein the M inconsecutive time units comprise a first time unit, a second time unit, and a third time unit that are sorted in ascending order of time sequence index values; and
   wherein a first time interval between the first time unit and the second time unit and a second time interval between the second time unit and the third time unit meet the following condition: the second time interval is greater than or equal to a sum of the first time interval, the first time unit, and the second time unit.

9. The method according to claim 8, wherein the performing, by the receive end, second inverse transformation on a decoded sequence comprises:
- performing, by the receive end, at least two levels of grouping on the decoded sequence; and
- performing, by the receive end, second inverse transformation on a sequence obtained after each-level grouping except $i^{th}$-level grouping, wherein M inverse transformation amounts are used for a sequence obtained after the $i^{th}$-level grouping, and wherein the M inverse transformation amounts are used to indicate time sequence index values of the M inconsecutive time units.

10. The method according to claim 8, wherein the performing, by the receive end, a first inverse transformation operation and polar code decoding on the to-be-decoded information based on time intervals between M inconsecutive time units comprises:
- determining, by the receive end and based on the time intervals between the M inconsecutive time units, a first inverse transformation amount used for a sending sequence in each time unit;
- performing, by the receive end, first inverse transformation on the to-be-decoded information by using the first inverse transformation amount;
- performing soft combination on sequences obtained after the first inverse transformation; and
- performing, by the receive end, polar code decoding on a sequence obtained after the soft combination.

11. A polar code transmission apparatus, comprising:
- at least one processor; and
- a memory storing instructions executable by the at least one processor, wherein the instructions, when executed by the at least one processor, instruct the at least one processor to:
- perform polar encoding on a to-be-encoded first bit sequence, to generate an encoded sequence;
- perform a transformation operation on the encoded sequence, to obtain a second bit sequence, wherein the transformation operation comprises at least one of scrambling, interleaving, or reordering; and
- send the second bit sequence in M inconsecutive time units, wherein at least two time intervals between the time units in the M inconsecutive time units are unequal.

12. The apparatus according to claim 11, wherein the M inconsecutive time units comprise a first time unit, a second time unit, and a third time unit that are sorted in ascending order of time sequence index values; and
- wherein a first time interval between the first time unit and the second time unit and a second time interval between the second time unit and the third time unit meet the following condition: the second time interval is greater than or equal to a sum of the first time interval, the first time unit, and the second time unit.

13. The apparatus according to claim 11, wherein the instructions further instruct the at least one processor to:
- perform at least two levels of grouping on the encoded sequence; and
- transform a sequence obtained after each-level grouping, wherein a transformation amount used to transform the sequence obtained after one level of grouping is used to indicate a time sequence index value in one level of time sequence transmission.

14. The apparatus according to claim 13, wherein M transformation amounts are used for a sequence obtained after one of the at least two levels of grouping, and wherein the M transformation amounts are used to indicate time sequence index values of the M inconsecutive time units.

15. The apparatus according to claim 11, wherein a time interval between two time units is used to indicate a manner in which a receive end performs soft combination on signals received in the two time units.

16. The apparatus according to claim 11, wherein the time interval between the two time units is used to indicate respective time sequence indexes of the two time units.

17. A polar code transmission apparatus, comprising:
- at least one processor; and
- a memory storing instructions executable by the at least one processor, wherein the instructions, when executed by the at least one processor, instruct the at least one processor to:
- obtain to-be-decoded information;
- perform a first inverse transformation operation and polar code decoding on the to-be-decoded information based on time intervals between M inconsecutive time units, wherein at least two time intervals between the time units in the M inconsecutive time units are unequal, and wherein the inverse transformation operation comprises at least one of descrambling, de-interleaving, and inverse reordering; and
- perform a second inverse transformation operation on a decoded sequence.

18. The apparatus according to claim 17, wherein the M inconsecutive time units comprise a first time unit, a second time unit, and a third time unit that are sorted in ascending order of time sequence index values; and
- wherein a first time interval between the first time unit and the second time unit and a second time interval between the second time unit and the third time unit meet the following condition: the second time interval is greater than or equal to a sum of the first time interval, the first time unit, and the second time unit.

19. The apparatus according to claim 18, wherein the instructions further instruct the at least one processor to:
- perform at least two levels of grouping on the decoded sequence; and
- perform second inverse transformation on a sequence obtained after each-level grouping except $i^{th}$-level grouping, wherein M inverse transformation amounts are used for a sequence obtained after the $i^{th}$-level grouping, and wherein the M inverse transformation amounts are used to indicate time sequence index values of the M inconsecutive time units.

20. The apparatus according to claim 17, wherein the instructions further instruct the at least one processor to:
- determine, based on the time intervals between the M inconsecutive time units, a first inverse transformation amount used for a sending sequence in each time unit;
- perform first inverse transformation on the to-be-decoded information by using the first inverse transformation amount;
- perform soft combination on sequences obtained after the first inverse transformation; and
- perform polar code decoding on a sequence obtained after the soft combination.

* * * * *